United States Patent
Eldridge et al.

(10) Patent No.: US 10,527,647 B2
(45) Date of Patent: Jan. 7, 2020

(54) PROBE HEAD WITH INDUCTANCE REDUCING STRUCTURE

(71) Applicant: FormFactor, Inc., Livermore, CA (US)

(72) Inventors: Benjamin N. Eldridge, Danville, CA (US); Edin Sijercic, Portland, OR (US); Eric Hill, Portland, OR (US); John Ebner, Portland, OR (US)

(73) Assignee: FormFactor, Inc., Livermore, CA (US)

( * ) Notice: Subject to any disclaimer, the term of this patent is extended or adjusted under 35 U.S.C. 154(b) by 15 days.

(21) Appl. No.: 16/016,141

(22) Filed: Jun. 22, 2018

(65) Prior Publication Data

US 2018/0299486 A1 Oct. 18, 2018

Related U.S. Application Data

(63) Continuation-in-part of application No. 14/327,254, filed on Jul. 9, 2014, now Pat. No. 10,132,833.

(60) Provisional application No. 61/843,966, filed on Jul. 9, 2013.

(51) Int. Cl.
*G01R 31/02* (2006.01)
*G01R 1/067* (2006.01)
*G01R 1/073* (2006.01)

(52) U.S. Cl.
CPC ..... *G01R 1/06733* (2013.01); *G01R 1/07314* (2013.01)

(58) Field of Classification Search
USPC .................................. 324/754.03, 756.03
See application file for complete search history.

(56) References Cited

U.S. PATENT DOCUMENTS

2014/0176173 A1\* 6/2014 Shinohara .......... G01R 31/2601
324/754.07

\* cited by examiner

*Primary Examiner* — Vincent Q Nguyen
(74) *Attorney, Agent, or Firm* — Lumen Patent Firm

(57) ABSTRACT

Improved impedance matching is provided in vertical probe arrays having conductive guide plates by providing ground pins connecting the guide plates that do not mechanically touch the device under test or the input test apparatus. Such ground pins can be disposed in predetermined patterns around corresponding signal probes to improve an impedance match between the probes and the test apparatus and/or the device under test. Preferably all impedances are matched to 50Ω as is customary for high frequency work.

14 Claims, 19 Drawing Sheets

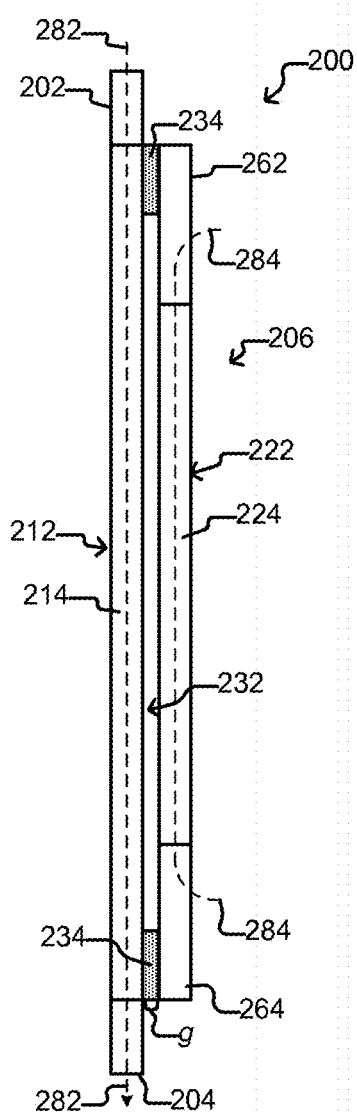
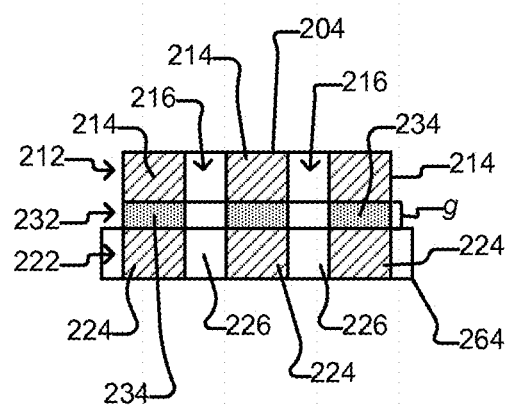

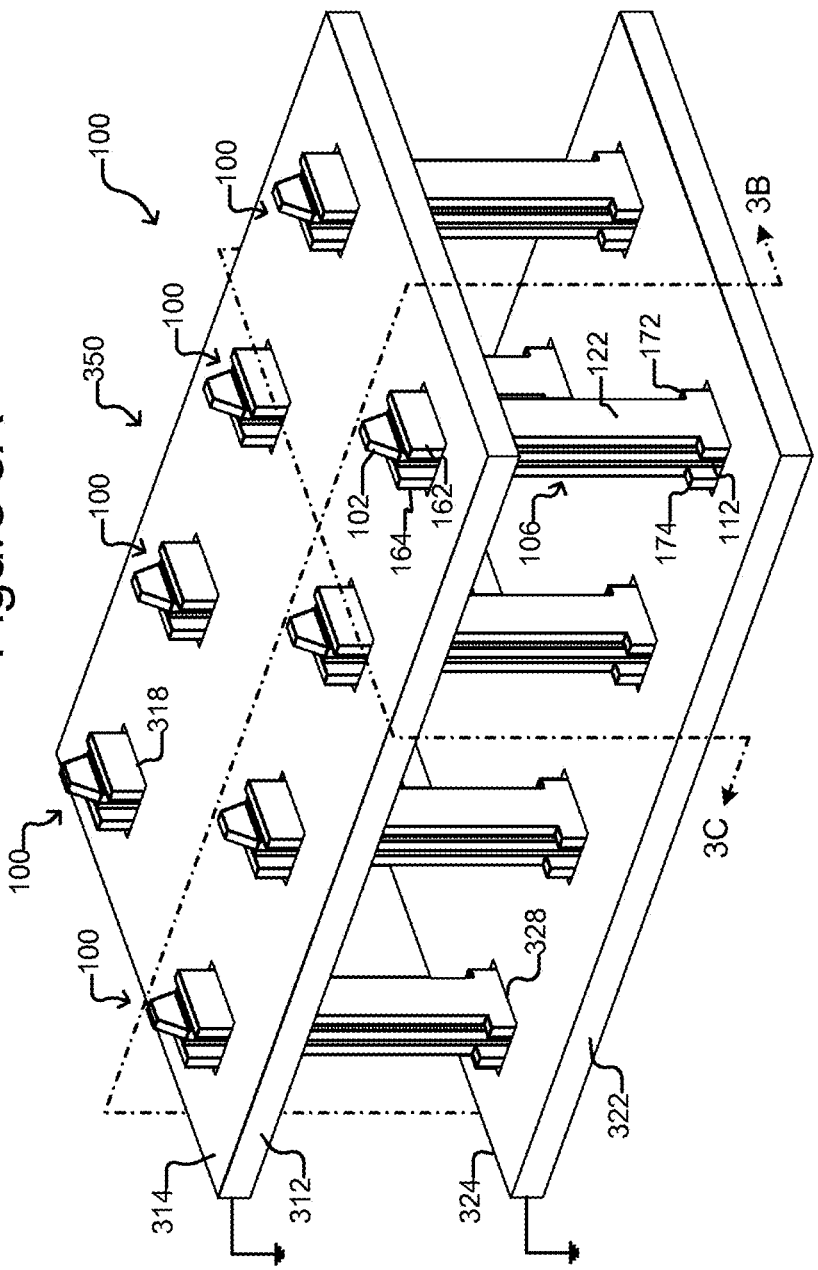

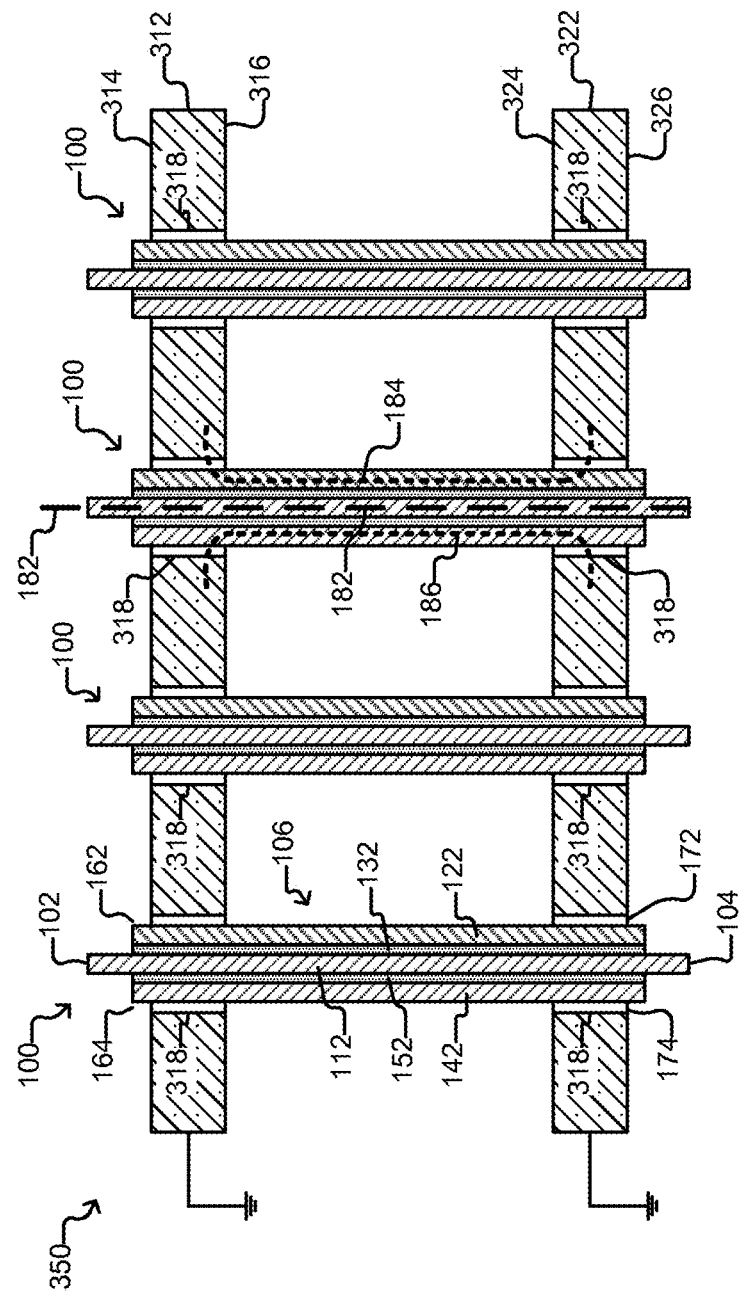

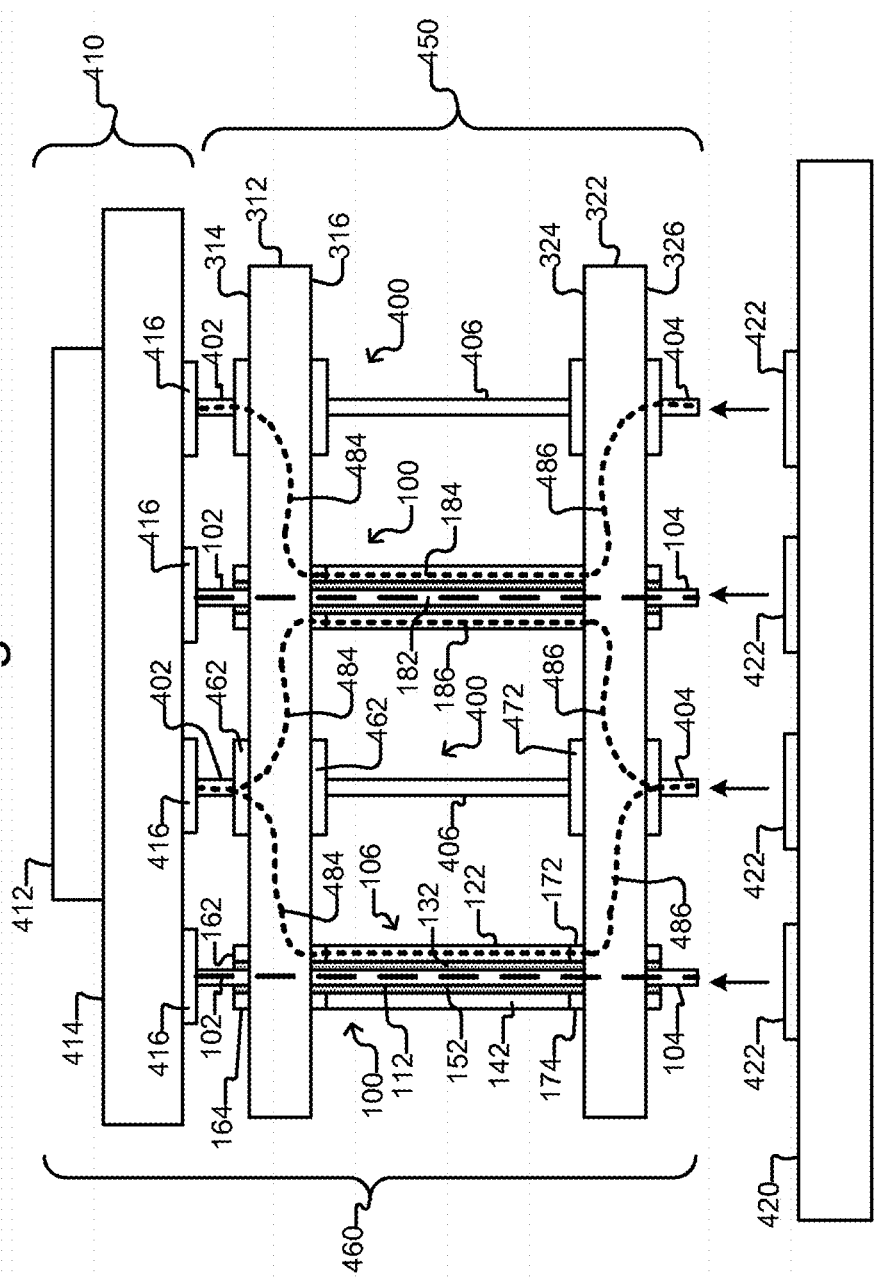

PROBE HEAD WITH INDUCTANCE REDUCING STRUCTURE

CROSS REFERENCE TO RELATED APPLICATIONS

This application is a continuation in part of U.S. patent application Ser. No. 14/327,254, filed on Jul. 9, 2014, and hereby incorporated by reference in its entirety.

Application Ser. No. 14/327,254 claims the benefit of U.S. provisional patent application 61/843,966, filed on Jul. 9, 2013, and hereby incorporated by reference in its entirety.

BACKGROUND

The inductance (e.g., loop inductance) of a test probe for contacting and providing test signals to and sensing result signals from an electronic device under test (DUT) can affect tests performed on the DUT. For example, the inductance can affect the frequency at which test signals can be provided to the DUT. Some embodiments of the present invention provide improvements to test probes that can reduce inductance, such as loop inductance, of the test probes.

SUMMARY

In some embodiments, a multipath probe can include an electrically conductive first contact end and an electrically conductive second contact end. The probe can also include an electrically conductive signal path and an electrically conductive secondary path. The signal path can be between the first contact end and the second contact end, and the secondary path can be electrically insulated from the signal path. There can be a gap of less than fifty microns between the signal path and the secondary path.

In some embodiments, an electrical apparatus can include electrically conductive first and second guide plates each of which can include through passages. Probes can be disposed in part in passages through the first guide plate with first contact ends of the probes located to a first side of the first guide plate, and the probes can also be disposed in part in passages through the second guide plate with second contact ends of the probes located to a second side of the second guide plate. The apparatus can also include an electrically conductive signal path and an electrically conductive secondary path. The signal path can be through one of the probes from its first contact end to its second contact end, and the signal path can be electrically insulated from the first guide plate, the second guide plate, and the secondary path. The secondary path can be through one of the probes from the first guide plate to the second guide plate.

In some embodiments, an electrically conductive probe can include an electrically conductive first contact end and an electrically conductive second contact end. An electrically conductive structure can electrically connect the first contact end and the second contact end. An electrically conductive secondary contact can be disposed between the first contact end and the second contact end and extend away from the conductive structure. An electrically insulating coating can cover at least part of the secondary contact.

In some embodiments, improved impedance matching is provided in vertical probe arrays having conductive guide plates by providing ground pins connecting the guide plates that do not mechanically touch the device under test or the input test apparatus. Such ground pins can be disposed in predetermined patterns around corresponding signal probes to improve an impedance match between the probes and the test apparatus and/or the device under test. Preferably all impedances are matched to 50Ω as is customary for high frequency work.

BRIEF DESCRIPTION OF THE DRAWINGS

FIG. 2D is a side view and FIG. 2E is a cross-sectional top view of the probe of FIG. 2A.

FIG. 3A illustrates a perspective view of an example of a probe assembly comprising guide plates with through passages in which a plurality of multipath probes are disposed according to some embodiments of the invention.

FIGS. 3B and 3C are side cross-sectional views of the probe assembly of FIG. 3A.

FIG. 4 is an example of a test contactor comprising an example of a variation of the probe assembly of FIGS. 3A-3C according to some embodiments of the invention.

DETAILED DESCRIPTION

Figure 1A:
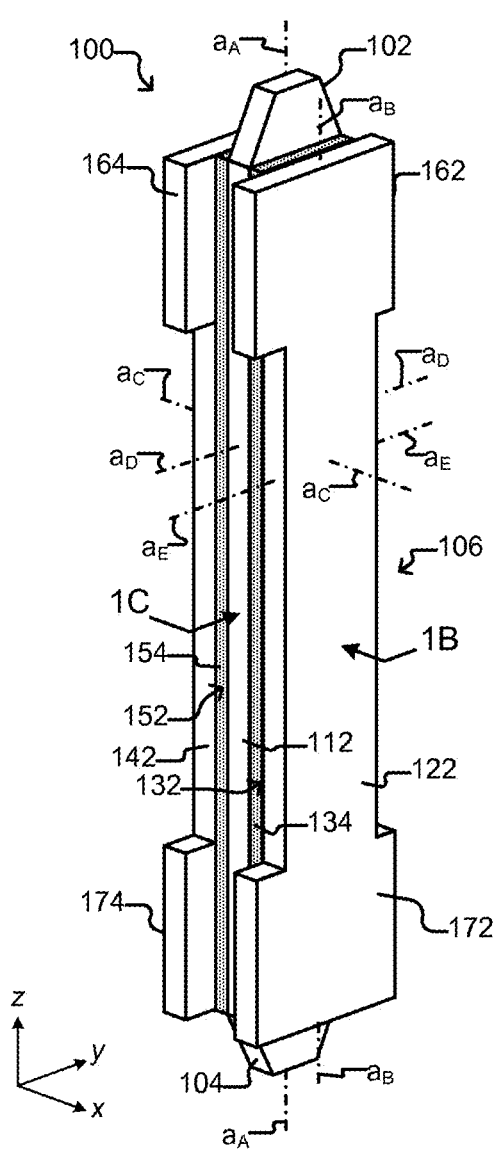
FIG. 1A is a perspective view of an example of a multipath probe according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the figures may show simplified or partial views, and the dimensions of elements in the figures may be exaggerated or otherwise not in proportion. In addition, as the terms "on,"

"attached to," "connected to," "coupled to," or similar words are used herein, one element (e.g., a material, a layer, a substrate, etc.) can be "on," "attached to," "connected to," or "coupled to" another element regardless of whether the one element is directly on, attached to, connected to, or coupled to the other element or there are one or more intervening elements between the one element and the other element. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, "substantially" means sufficient to work for the intended purpose. The term "substantially" thus allows for minor, insignificant variations from an absolute or perfect state, dimension, measurement, result, or the like such as would be expected by a person of ordinary skill in the field but that do not appreciably affect overall performance. When used with respect to numerical values or parameters or characteristics that can be expressed as numerical values, "substantially" means within fifty percent. The term "ones" means more than one. The term "disposed" encompasses within its meaning "located."

In some embodiments, a multiple conduction path probe (hereinafter a "multipath probe") can provide an electrically conductive signal path from a first contact end to a second contact end. The probe can also include an electrically conductive secondary path and an electrically insulating gap between the signal path and the secondary path. The insulating gap, however, can be less than or equal to a maximum distance that results in a loop inductance for the probe that is less than a maximum loop inductance. A probe assembly can comprise a plurality of such multipath probes disposed in passages in electrically conductive guide plates. The signal path of each of the probes can be electrically insulated from both guide plates, but the secondary path of each probe can be electrically connected to one or both of the guide plates. In some embodiments, the probe assembly can include one or more secondary probes disposed in passages of the conductive guide plates and electrically connected to one or both of the guide plates. Such secondary probes can be configured to connect to a secondary voltage potential such as ground and thus electrically connect one or both of the guide plates to the secondary voltage potential. In some embodiments, a probe assembly can comprise probes that are substantially the same shape and/or configuration all of which are disposed in passages through the guide plates. Some of the probes can be electrically insulated from the guide plates and thus provide signal paths, and others of the probes can be electrically connected to the guide plates and thus provide secondary paths. In some embodiments, any of the foregoing types of probe assemblies can be part of a test contactor such as a probe card assembly, a load board, or the like.

Figure 1B:
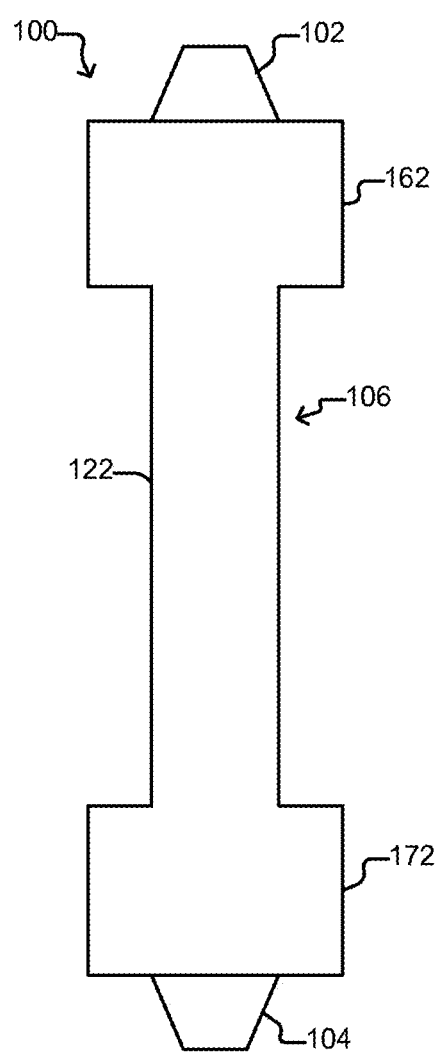
FIG. 1B is a front view and FIG. 1C is a side view of the probe of FIG. 1A.
Figure 1C:
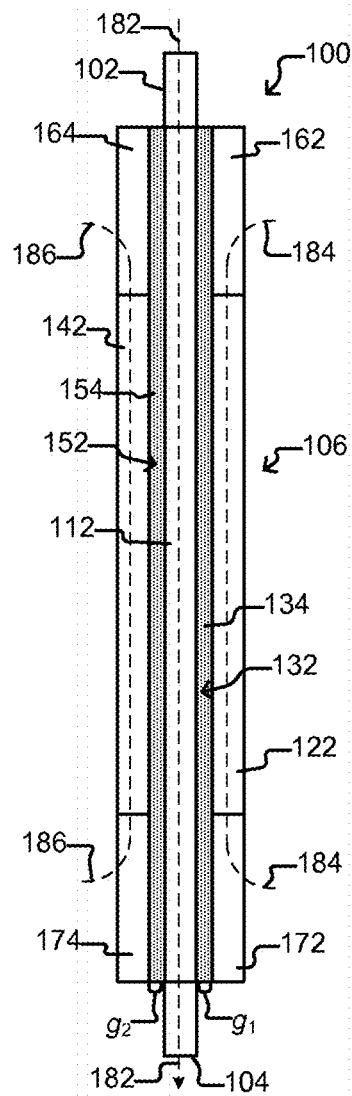

FIGS. 1A-1C illustrate an example of a multipath probe 100. FIG. 1A is a perspective view, FIG. 1B is a front view, and FIG. 1C is a side view of the probe 100.

The multipath probe 100 of FIGS. 1A-1C can comprise contact ends 102, 104 and an electrically conductive path 182 (see FIG. 1C) between the contact ends 102, 104. The probe 100 can also comprise one or more electrically conductive secondary paths 184, 186 (two are shown in FIG. 1C but there can be one or more than two), each of which can be electrically insulated from the signal path 182 by an electrically insulating gap 132, 152. The secondary paths 184, 186 can also be electrically insulated from each other.

Figure 6:
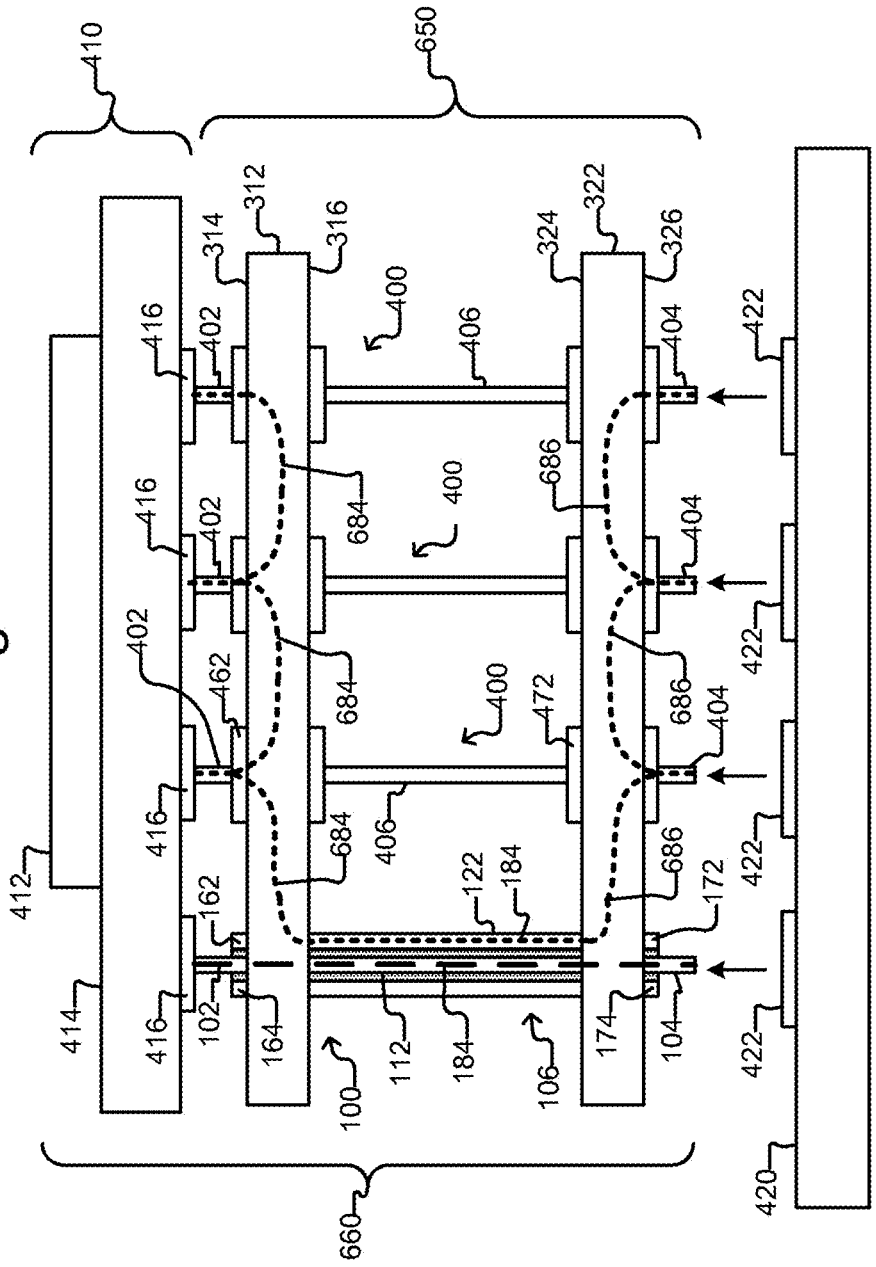
FIG. 6 is another example of a test contactor according to some embodiments of the invention.

As illustrated, the signal path 182 can comprise an electrically conductive structure 112 (hereinafter referred to as a "signal structure" because it is part of the signal path 182), which can electrically and physically connect the first contact end 102 to the second contact end 104. The contact ends 102, 104 can be electrically conductive. The first contact end 102 can be sized and configured to contact a first electronic device (not shown in FIGS. 1A-1C), and the second contact end 104 can be sized and configured to contact a second electronic device (not shown in FIGS. 1A-1C). The probe 100, and more specifically the signal path 182 comprising the first contact end 102, the signal structure 112, and the second contact end 104, can thus electrically connect first and second electronic devices (not shown). Examples in which multiple such probes 100 connect a test interface structure 410 (an example of a first electronic device) to an electronic device under test (DUT) 420 (an example of a second electronic device) are illustrated in FIGS. 4 and 6 and discussed below.

As also shown, a first of the secondary paths 184 can comprise a first secondary contact 162, a second secondary contact 172, and a secondary structure 122 all of which can be electrically conductive. The secondary structure 122 can electrically and physically connect the first secondary contact 162 to the second secondary contact 172. As will be seen, the first secondary contact 162 can be configured to contact and thus make an electrical connection with a first electrical element (not shown in FIGS. 1A-1C) such as the first guide plate 312 shown in FIGS. 3A-3C, and the second secondary contact 172 can be configured to contact and thus make an electrical connection with a second electrical element (not shown in FIGS. 1A-1C) such as the second guide plate 322 in FIGS. 3A-3C.

The secondary path 184 can be electrically insulated from the signal path 182. For example, an electrically insulating gap 132 can separate the secondary path 184 from the signal path 182. In the example shown in FIGS. 1A-1C, the gap 132 is directly between the secondary structure 122 and the signal structure 112, and the gap 132 also effectively electrically insulates the contact ends 102, 104 of the signal path 182 from the secondary contacts 162, 172.

In some embodiments, the gap 132 can be sufficiently large to electrically insulate the secondary structure 122 from the signal structure 112 but sufficiently small to maintain a relatively small loop inductance in applications in which the signal path 182 is utilized as a delivery path for a signal from a signal source (not shown) and the secondary path 184 is a return path (e.g., ground) to the signal source. For example, a size $g_1$ (e.g., along an axis $a_C$, which is discussed below) of the gap 132 from the signal structure 112 to the secondary structure 122 can be less than or equal to fifty microns, less than or equal to forty microns, less than or equal to thirty microns, less than or equal to twenty microns, less than or equal to ten microns, less than or equal to five microns, or the like. As noted, such relatively small gap values can advantageously provide relatively low loop inductances (e.g., less than 0.4 nano-Henries (nH), less than 0.2 nH, or the like) in some embodiments.

Regardless of the size $g_1$ of the gap 132, the gap 132 can be configured in any of a variety of ways. For example, the gap 132 can comprise in whole or in part an empty (e.g., ambient air) space. As another example (which is illustrated in FIGS. 1A-1C), the gap 132 can comprise an electrically insulating material 134.

As noted, in the example illustrated in FIGS. 1A-1C, the multipath probe 100 can include another electrically conductive secondary path 186, which can be generally similar to the secondary conductive path 184. For example, the secondary path 186 can comprise an electrically conductive first secondary contact 164, an electrically conductive secondary structure 142, and an electrically conductive second secondary contact 174, which can be generally similar to or the same as the first secondary contact 162, the secondary structure 122, and the second secondary contact 172 as discussed above. An insulating gap 152 similar to or the same as the insulating gap 132 discussed above can separate and thus electrically insulate the secondary structure 142 from the signal structure 112. The gap 152 can be sized $g_2$ generally similar to or the same as the gap 132 is sized $g_1$ as discussed above, and the gap 152 can comprise materials that are similar to or the same as the gap 132. For example, all or part of the gap 152 can comprise empty space (e.g., ambient air) and/or insulating material 154.

In the example of the multipath probe 100 shown in FIGS. 1A-1C, the contact ends 102, 104 are shown substantially aligned on an axis $a_A$ axis, and the first secondary contact 162 and the second secondary contact 172 are illustrated aligned on an axis $a_B$. The axes $a_A$, $a_B$ can be substantially parallel to each other and also substantially parallel to the z axis in an x, y, z coordinate system as shown in FIG. 1A. The foregoing, however, is merely an example, and the second contact end 104 can be offset from the first contact end 102, and/or the second secondary contact 164 can be offset from the first secondary contact 162.

In some embodiments, the signal structure 112 can be aligned in a stacked relationship with the secondary structure 122 along an axis $a_C$, which can be substantially perpendicular to the axes $a_A$, $a_B$. As also illustrated, in some embodiments, the signal structure 112 and the secondary structure 122 can be elongated. For example, the length of the signal structure 112 along the axis $a_A$ can be its longest dimension and thus can be longer (e.g., at least two, three, four, five, or more times longer) than a dimension of the signal structure 112 along an axis $a_D$ that is substantially perpendicular to the axes $a_A$, $a_B$, $a_C$. Similarly, the length of the secondary structure 122 along the axis $a_B$ can be its longest dimension and thus can be longer (e.g., at least two, three, four, five, or more times longer) than the dimension of the secondary structure 122 along an axis $a_E$ that is substantially parallel to the axis $a_D$ and/or substantially perpendicular to the axes $a_A$, $a_B$, $a_C$.

As shown in FIG. 1A, the axes $a_A$, $a_B$ can be substantially parallel to the z axis in an x, y, z coordinate system; the axis $a_C$ can be substantially parallel to the y axis; and the axes $a_D$, $a_E$ can be substantially parallel to the y axis. Moreover, the axes $a_A$ and $a_B$ can be substantially parallel to each other and substantially perpendicular to the axes $a_C$, $a_D$, $a_E$. In addition, the axis $a_C$ can be substantially perpendicular to the axes $a_D$, $a_E$, which can be substantially parallel to each other. Each of the axes $a_A$, $a_B$, $a_C$, $a_D$, $a_E$ can be an example of a first, a second, a third, a fourth, or a fifth axis.

In some embodiments, the size $g_1$ of the gap 132 between the secondary structure 122 and the signal structure 122 can be a dimension that is substantially parallel to the axis $a_C$. Moreover, the size $g_1$ of the gap 132 can be substantially the same from the first contact end 102 to the second contact end 104.

Alternatively, the size of the gap 132 need not be uniform from the first contact end 102 to the second contact end 104 but can be less than or equal to the gap size $g_1$ from the first contact end 102 to the second contact end 104.

The body 106 of the probe 100 between the contact ends 102, 104 can be compliant (e.g., flexible) and resilient. For example, with the first contact end 102 fixed in place, the signal structure 112 and/or the secondary structures 122, 142 (including any insulating material 134, 154 in the insulating gaps 132, 152) can be sufficiently compliant to move in the z direction and/or the x, y plane of the x, y, z coordinate system mentioned above and illustrated in FIG. 1A in response to a contact force arising from the second contact end 104 being brought into contact with an electronic device (not shown) such as the DUT 420 of FIGS. 4 and 6. For example, when an electronic device such as the DUT 420 is pressed against the second contact end 104, the body 106 can be flexible enough to move in the z direction and/or the x, y plane in response to the contact force on the second contact end 104. For example, the body 106 can be sufficiently flexible for the contact end 104 to move at least two-hundred microns in the z direction or the x, y plane. As another example, the body 106 can be sufficiently flexible for the contact end 104 to move between three-hundred and four-hundred microns in the z direction or the x, y plane. In either of the foregoing two examples, in some embodiments, a length of the body 106 between the contact ends 102, 104 can be at least one millimeter, between one and half millimeters and two millimeters, or the like. The foregoing numerical values and ranges are examples only, and some embodiments of the invention can have other values in other ranges. Regardless, the body 106 (e.g., the signal structure 112 and/or the secondary structures 122, 142) can also be sufficiently resilient that the body 106 returns substantially to its original unloaded position when the contact force is removed from the contact end 104 (e.g., when the electronic device such as the DUT 420 of FIGS. 4 and 6 is moved out of contact with the contact end 104).

The elements of the other secondary path 186—the first secondary contact 164, secondary structure 142, and second secondary contact 174 illustrated in FIGS. 1A-1C—can be aligned and have dimensions and characteristics that are similar to or the same as the first secondary contact 162, secondary structure 122, and second secondary contact 172 as those elements are discussed above. Moreover, the size $g_2$ of the gap 152 between the signal structure 112 and the secondary structure 142 can have any of the characteristics of the gap size $g_1$ of the gap 132 discussed above.

The first secondary contacts 162, 172 and the first secondary structure 122 can be integrally formed of the same material and thus constitute a single, unitary structure. Alternatively, the first secondary contacts 162, 172 and the secondary structure 122 can be distinct structures that are coupled one to another. Similarly, the second secondary contacts 164, 174 and the second secondary structure 142 can be integrally formed of the same material and thus constitute a single, unitary structure, or alternatively, can be distinct structures that are coupled one to another.

The configuration of the probe 100 illustrated in FIGS. 1A-1C is an example only, and many variations are possible. For example, the signal structure 112 and the secondary structure 122 can be curved (e.g., generally like the leaf structures 214, 224 illustrated in FIGS. 2A-2E and discussed below). The probe 200 shown in FIGS. 2A-2E illustrates examples of other variations including configurations comprising leaf structures.

Figure 2A:
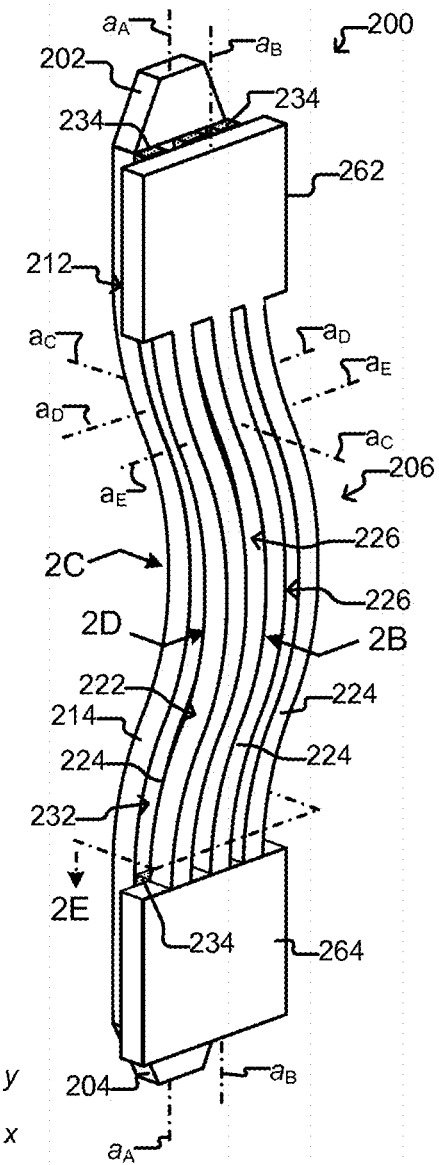
FIG. 2A is a perspective view of another example of a multipath probe according to some embodiments of the invention.
Figure 2B:
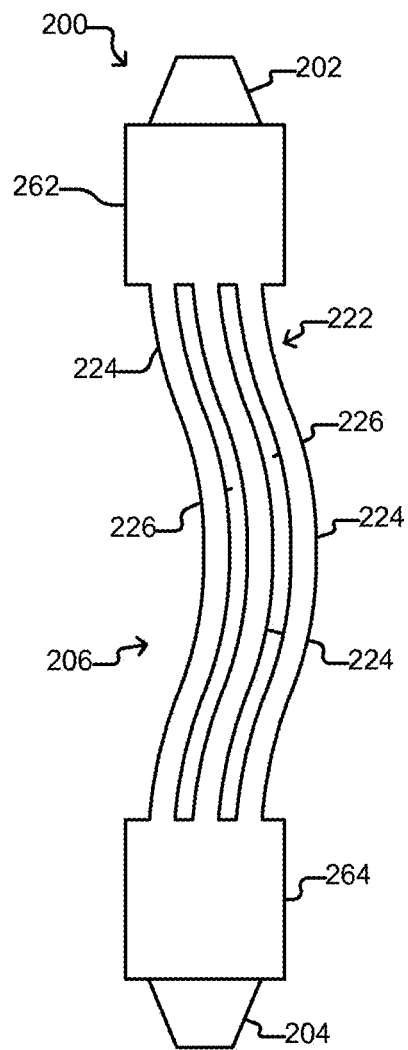
FIG. 2B is a front view and FIG. 2C is a back view of the probe of FIG. 2A.
Figure 2C:
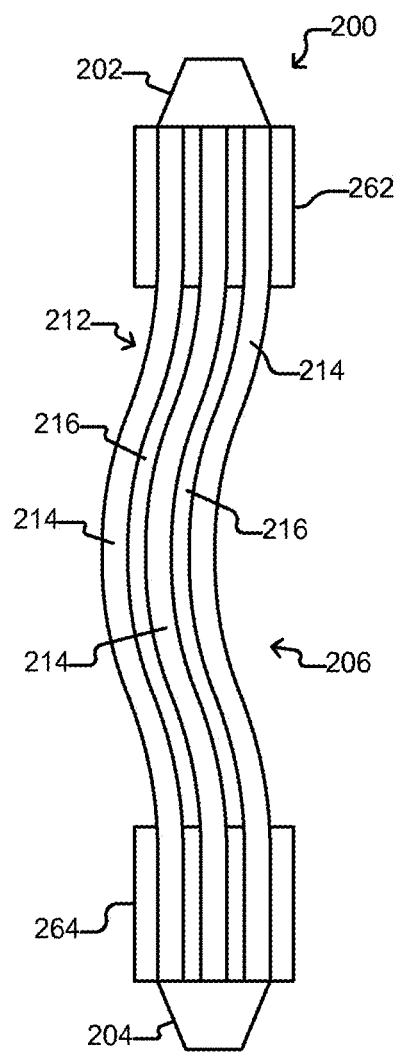

FIGS. 2A-2E illustrate another example of a multipath probe 200. FIG. 2A is a perspective view, FIG. 2B is a front view, FIG. 2C is a back view, FIG. 2D is a side view, and FIG. 2E is a top cross-sectional view of the probe 200.

The probe 200 can comprise electrically conductive contact ends 202, 204, an electrically conductive signal path 282 (see FIG. 2D) from the first contact end 202 to the second contact end 204, and an electrically conductive secondary path 284 (one is shown in FIG. 2D but there can be more), which can be electrically insulated from the signal path 282 by an electrically insulating gap 232. As shown, in some embodiments, the signal path 284 can comprise the contact ends 202, 204 and a signal structure 212 that physically and electrically connects the contact ends 202, 204. As also shown, the secondary path 284 can comprise electrically conductive secondary contacts 262, 272 and an electrically conductive secondary structure 222 that physically and electrically connects the secondary contacts 262, 272.

The contact ends 202, 204 can be similar to or the same as the contact ends 102, 104 of FIGS. 1A-1C. The secondary contacts 262, 272 can likewise be similar to or the same as the secondary contacts 162, 172 of FIGS. 1A-1C. Moreover, the electrically insulating gap 232 can be similar to or the same as the gap 132 as discussed above with respect to FIGS. 1A-1C. For example, although the gap 232 is illustrated in FIGS. 2A-2E as comprising mostly empty space (e.g., ambient air) with electrically insulating material 234 only near the secondary contacts 162, 172, the gap 232 can instead comprise more insulating material 234 and can, in some embodiments, consist entirely of insulating material 234 generally as the gap 132 is illustrated in FIGS. 1A-1C. As another example, the gap 232 can consist entirely of empty space (e.g., ambient air). The size g of the gap 232 can have any of the characteristics and values of any of the sizes $g_1$, $g_2$ of the gaps 132, 152 discussed above.

Although the contact ends 202, 204 are illustrated in FIG. 2A as aligned on the axis $a_A$ generally as discussed above with respect to the contact ends 102, 104 in FIGS. 1A-1C, the second contact end 204 can instead by offset from the first contact end 202. Similarly, the secondary contacts 262, 272 are shown in FIG. 2A aligned on the axis $a_B$ but can instead be offset one from another.

The signal structure 212 can comprise a plurality of electrically conductive leaf structures 214 separated by spaces 216 between adjacent leaf structures 214. Three leaf structures 214 are shown in FIGS. 2A-2E but there can be fewer or more. As shown, each leaf structure 214 can be generally elongated with its longest dimension substantially parallel to the axis $a_A$. As also shown, the leaf structures 214 and spaces 216 of the signal structure 212 can be disposed one next to the other along the axis $a_D$, which as discussed above, can be substantially perpendicular to the axes $a_A$, $a_B$, $a_C$. In some embodiments, the signal structure 212 can be aligned in a stacked relationship with the secondary structure 222 along the axis $a_C$.

The secondary structure 222 can similarly comprise a plurality of electrically conductive leaf structures 224 separated by spaces 226 between adjacent leaf structures 224. Three leaf structures 224 are shown in FIGS. 2A-2E but there can be fewer or more. Like the leaf structures 214, each leaf structure 224 can be elongated with its longest dimension substantially parallel to the axes $a_A$, $a_B$. As also shown, the leaf structures 224 and spaces 226 can be disposed one next to the other along the axis $a_E$, which as discussed above, can be substantially parallel to the axis $a_D$ and substantially perpendicular to the axes $a_A$, $a_B$, $a_C$.

As shown in FIGS. 2A-2E, the leaf structures 214 of the signal structure 212 can be curved. For example, each leaf structure 214 can curve away from and then back towards an axis (not shown) that passes through ends of the leaf structure 214 and is substantially parallel to the axes $a_A$, $a_B$. The signal structure 212 itself can thus be curved. For example, the signal structure 212 can curve away from and then back to the axis $a_A$ as illustrated in FIG. 2A. Alternatively, the leaf structures 214 and thus also the signal structure 212 can be straight generally as the signal structure 112 is illustrated in FIGS. 1A-1C as straight and not substantially curved with respect to the axis $a_A$. The leaf structures 224 of the secondary structure 222—and thus the secondary structure 222 itself—can also be curved with respect to the axis $a_B$ generally the same as the leaf structures 214 of the signal structure 212. Regardless the signal structure 212, the secondary structure 222, and any insulating material 154 can have any of the compliance and resilience properties discussed above with respect to the signal structure 112 and secondary structure 122.

The probe 200 shown in FIGS. 2A-2E is an example, and many variations are possible. For example, the probe 200 can include another set of secondary contacts and a secondary structure similar to 262, 264, 222 but disposed on the opposite side if the signal structure 212 in generally the same location as the secondary contacts 164, 174 and secondary structure 142 in FIGS. 1A-1C. As another example, although illustrated with the same number of leaf structures, the signal structure 212 can have more or fewer leaf structures 214 than the number of leaf structures 224 of the secondary structure 222

The secondary contacts 262, 272 and the secondary structure 222 can be integrally formed of the same material and thus constitute a single, unitary structure. Alternatively, the secondary contacts 262, 272 and the secondary structure 222 can be distinct structures that are coupled one to another.

The multipath probes 100, 200 can be utilized in any of a number of different applications. FIGS. 3A-6 illustrate examples of such applications. Although probe 100 is identified in each of FIGS. 3A-6, probe 200 can be substituted for probe 100 in FIGS. 3A-6.

Figure 3C:
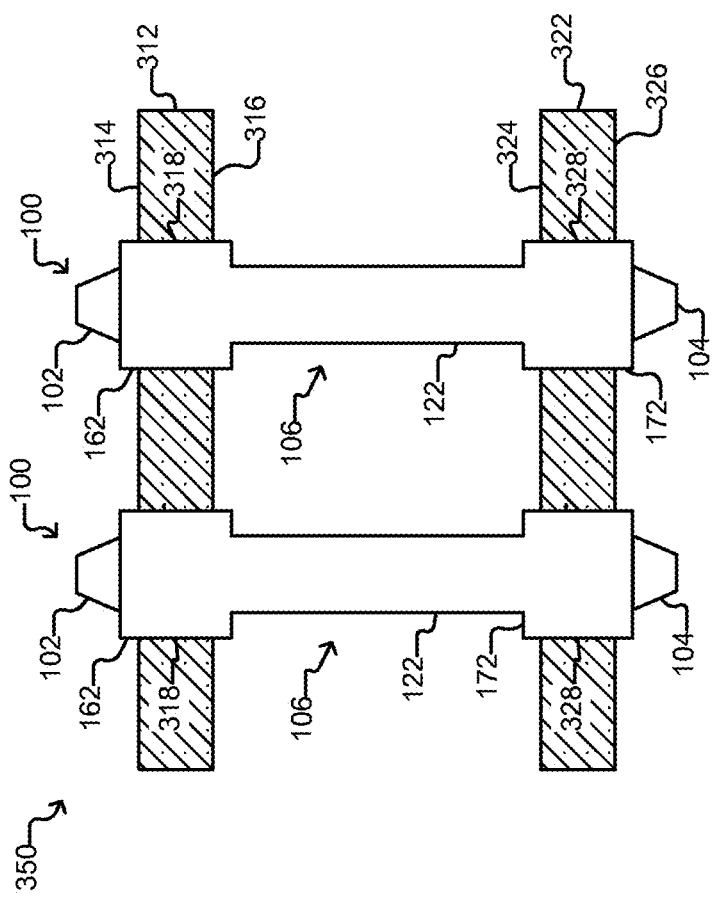

FIGS. 3A-3C illustrate an example of a probe assembly 350 comprising multipath probes 100. As shown, the probe assembly 350 can comprise electrically conductive guide plates 312, 322, which can be substantially parallel but spaced apart one from another. The first guide plate 312 can comprise through passages 318 that extend from a first side 314 (e.g., an outer side) to a second side 316 (e.g., an inner side) of the first guide plate 312. The second guide plate 322 can similarly comprise through passages 328 that extend from a first side 324 (e.g., an inner side) to a second side 326 (e.g., an outer side) of the second guide plate 322. The guide plates 312, 322 can be coupled to each other such that a passage 318 in the first guide plate 312 substantially aligns with a corresponding passage 328 in the second guide plate 322. For example, the guide plates 312, 322 can be coupled to each other by bolts, screws, clamps, adhesives, or the like.

As illustrated in FIGS. 3A-3C, the first side 314 of the first guide plate 312 can be opposite the second side 316, and the first side 324 of the second guide plate 322 can similarly be opposite the second side 326. Moreover, guide plates 312, 322 can be coupled to each other such that there is a space between the guide plates 312, 322, and the second side 316 of the first guide plate 312 can face the first side 324 of the second guide plate 322, The sides 314, 316, 324, 326 of the guide plates 312, 322 can be substantially planar surfaces.

The secondary contacts 162, 172 adjacent the first contact end 102 can be disposed in a passage 318 in the first guide plate 312, and the secondary contacts 164, 174 adjacent the second contact end 104 can be disposed in a corresponding passage 328 in the second guide plate 322. As illustrated in FIG. 3C, passages 318 in the first guide plate 312 can be sized in at least one dimension so that the secondary contacts 162, 172 adjacent the first contact end 102 contact and thereby electrically connect to the first guide plate 312. As illustrated in FIG. 3B, however, the passages 318 in the first guide plate 312 can be sized in another dimension to provide space between sidewalls of the passage 318 and the secondary contacts 162, 172 adjacent the first contact end 102. The passages 318 in the first guide plate 312 can thus be sized to allow the secondary contacts 162, 172 of a probe 100 to move (e.g., up and down in FIGS. 3A-3C) in the passage 318 while maintaining electrical contact with the passage 318 and thus the first guide plate 312.

Similarly, passages 328 in the second guide plate 322 can be sized in at least one dimension so that the secondary contacts 164, 174 adjacent the second contact end 104 contact and thereby electrically connect to the second guide plate 322 (see FIG. 3C), and the passages 328 in the second guide plate 322 can be sized in another dimension to provide space between sidewalls of the passage 328 and the secondary contacts 164, 174 adjacent the second contact end 104. The passages 328 in the second guide plate 322 can thus also be sized to allow the secondary contacts 164, 174 of a probe 100 to move (e.g., up and down in FIGS. 3A-3C) in the passage 328 while maintaining electrical contact with the passage 328 and thus the second guide plate 322.

A secondary voltage potential (e.g., ground) can be connected to one or both of the guide plates 312, 322. Each multipath probe 100 can thus provide a signal path 182 from its first contact end 102 to its second contact end 104 and a secondary path 184 from the first guide plate 312 through its secondary contact 162, secondary structure 122, and secondary contact 172 to the second guide plate 322. As also shown in FIG. 3B, each probe 100 can also provide another secondary path 186 from the first guide plate 312 through its secondary contact 164, secondary structure 142, and secondary contact 174 to the second guide plate 322.

The secondary path 184 can be physically separated and electrically insulated from the signal path 182 by the insulating gap 132, which can be less than or equal to the gap size $g_1$ as discussed above. Likewise, the secondary path 186 can be physically separated and electrically insulated from the signal path 182 by the insulating gap 152, which can be less than or equal to the gap size $g_2$ also as discussed above.

FIG. 4 shows an example of a test contactor 460 (e.g., a probe card assembly, a load board, or the like) in which multipath probes 100 are disposed in a variation of the probe assembly 350 of FIGS. 3A-3C. As shown, the test contactor 460 can comprise an interface structure 410 and a probe assembly 450.

The interface structure 410 can comprise an interface 412 that can be connected to a test controller (not shown) for controlling testing of an electronic device under test (DUT) 420 and a wiring substrate 414. The interface 412 can include individual connections (not shown) from the test controller (not shown) for test signals, control signals, power, ground, and/or the like. The wiring substrate 414 can include electrical connections (not shown) from the interface 412 to electrical terminals 416 (four are shown but there can be fewer or more), and multipath probes 100 and secondary probes 400 of the probe assembly 450 can connect the terminals 416 to input, output, control, power, and/or ground terminals 422 of a DUT 420. The DUT 420 can be any electronic device to be tested such as one or more semiconductor dies or the like.

The probe assembly 450 can be like the probe assembly 350 of FIGS. 3A-3C except secondary probes 400 can be disposed in one or more pairs of a passage 318 in the first guide plate 312 and a corresponding passage 328 in the second guide plate 322. In FIG. 4, there are two such secondary probes 400, but there can be only one or more than two.

Figure 5:
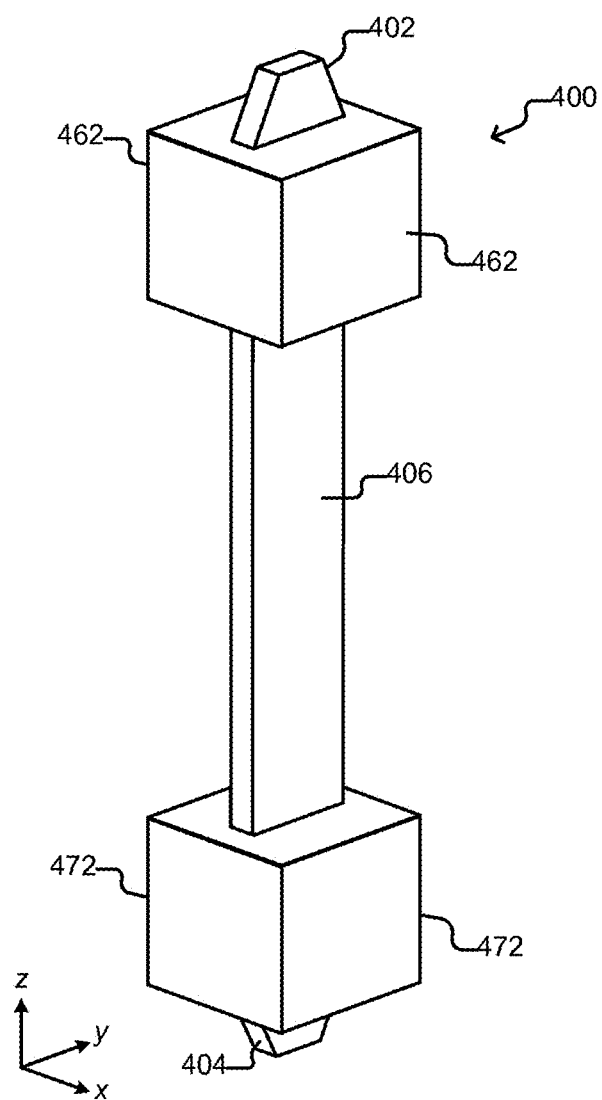
FIG. 5 is a perspective view of an example of a secondary probe according to some embodiments of the invention.

A secondary probe 400 can both provide an electrical connection from a terminal 416 of the wiring substrate 414 to a terminal 422 of the DUT 420 and contact and electrically connect to both guide plates 312, 322. A secondary probe 400 can have any physical structure or shape that provides the foregoing. FIG. 5 illustrates an example of a secondary probe 400

As shown, the secondary probe 400 of FIG. 5 can comprise a first contact end 402, a second contact end 404, and a body 406 disposed between and connecting the first contact end 402 to the second contact end 404. The contact ends 402, 404 and body 406 can be electrically conductive and can be structured like the contact ends 102, 104 and signal structure 112 of FIGS. 1A-1C. Although not shown, the body 406 can instead be structured like the signal structure 212 in FIGS. 2A-2E. For example, the body 406 can comprise spaced apart leaf structures like leaf structures 214 of the signal structure 212. As another example, the body 406 can be curved like the signal structure 212 of FIGS. 2A-2E.

As also shown in FIG. 5, the secondary probe 400 can comprise secondary contact 462 adjacent the first contact end 402 and secondary contact 472 adjacent the second contact end 404. The secondary contact 462 adjacent the first contact end 402 can be integrally formed with and thus constitute a single, unitary structure with the body 406. Alternatively, the secondary contact 462 can be a distinct structure coupled to the body 406. Similarly, the secondary contact 472 adjacent the second contact end 404 can be integrally formed with the body 406 or be a distinct structure coupled to the body 406.

Regardless, like the secondary contacts 162, 164 in FIGS. 1A-1C, the secondary contact 462 can be sized to fit into a passage 318 in the first guide plate 312 to contact sidewalls of the passage 318 and thus electrically connect to the first guide plate 312 while also being able to slide (e.g., up and down in FIG. 4) in the passage 318. Similarly, the secondary contact 472 adjacent the second contact end 404 can be sized to fit into, contact and thus electrically connect to, and slide (e.g., up and down in FIG. 4) in the passages 328 in the second guide plate 328. The body 406 can be compliant (e.g., flexible) and resilient generally like the body 106 of the probe 100 as discussed above.

The probe assembly 450 can be coupled to the interface structure 410 with the first contact ends 102 of the multipath probes 100 in contact with ones of the terminals 416 of the interface structure 410 and the first contact ends 402 of the secondary probes 400 in contact with others of the terminals 416. The probe assembly 450 can, for example, be coupled to the interface structure 410 with bolts, screws, clamps, adhesive, or the like. The second ends 104 of the multipath probes 100 and the second ends 404 of the secondary probes 400 can be disposed in a pattern that corresponds to the terminals 422 of the DUT. As will be seen, the secondary probes 400 can be disposed in the pattern of probes such that the first contact ends 402 contact interface terminals 416 that are in turn connected through the interface structure 410 to a return voltage potential (e.g., ground), and the second contact ends 404 can similarly contact DUT terminals 422 that are connected to the return voltage potential (e.g., ground) in the DUT 420.

A DUT 420 can be tested by pressing the terminals 422 of the DUT 420 into contact with corresponding ends 102, 402 of the multipath probes 100 and the secondary probes 400 generally as illustrated in FIG. 4. While the terminals 422 are in contact and forming electrical connections with the second ends 102, 402 of the multipath probes 100 and the secondary probes 400, electrical paths for test signals, control signals, power, and the like from the test controller (not shown) are provided through the interface 412 and the wiring substrate 414 to ones of the terminals 416 in contact with the first end 102 of the multipath probes 100 and then through the signal paths 182 of the multipath probes 100 to ones of the DUT terminals 422. The secondary probes 400, second guide plate 322, multipath probes 100, and first guide plate 312 can provide corresponding return paths from ones of the DUT terminals 422 in contact with second ends 404 of the secondary probes 400.

As shown in FIG. 4, such return paths from a DUT terminal 422 in contact with one of the secondary probes 400 to one of the interface terminals 416 in contact with the secondary probe 400 can comprise a second plate path 486, a secondary path 184, 186 and a first plate path 484. For example, the second plate path 486 can comprise a second contact end 404 of a secondary probe 400, the second secondary contact 472 of the secondary probe 400, and the second guide plate 322 from the second secondary contact 472 of the secondary probe 400 to a second secondary contact 172 of a multipath probe 100. As discussed above with respect to FIGS. 1A-1C, the secondary path 184 can comprise the secondary contact 172, the secondary structure 122, and the secondary contact 162 of the multipath probe 100; and the secondary path 186 can similarly comprise the secondary contact 174, the secondary structure 142, and the secondary contact 162 of the multipath probe 100. The first plate path 484 can comprise the first guide plate 312 from the first secondary contact 172 of the multipath probe 100 to the first secondary contact 462 of the secondary probe 400, the first secondary contact 462 of the secondary probe 400, and the first contact end 402 of the secondary probe 400. The size $g_1$ (see FIG. 1C) of the gap 132 between the signal path 182 and the secondary path 184 can be less than or equal to a maximum value as discussed above.

This can result in a relatively low loop inductance as also discussed above. For example, in some embodiments, for multipath probes 100 with dimensions (e.g., compliance capability, length of the body 106, and/or size $g_1$ of the gap 134) in the example ranges discussed above, the loop inductance of a probe 100 can be less than 0.4 nH, less than 0.2 nH, or the like. This can allow, in some embodiments, testing of the DUT to be performed at frequencies in radio frequency (RF) ranges.

FIG. 6 illustrates another example of a test contactor 660, which can be like the test contactor 460 of FIG. 4 except the probe assembly 650 can comprise multiple adjacent secondary probes 400. As shown, the multiple adjacent secondary probes 400 can create a daisy chained electrical path 684 in the first guide plate 312 and another daisy chained electrical path 686 in the second guide plate 322 from one adjacent secondary probe 400 to another. Otherwise, the probe assembly 660 can be like the probe assembly 460 of FIG. 4.

As noted above, the secondary probes 400 can be connected to secondary voltage potential (e.g., grounded) interface terminals 416 and/or secondary voltage potential (e.g., grounded) DUT terminals 416. The daisy-chained paths 584, 586 can thus be, in some embodiments, grounded electrical paths.

FIGS. 7-10 illustrate alternative embodiments in which secondary electrical paths are provided in a probe assembly 750, 950, which can be part of a test contactor 760, 960 comprising the interface structure 410.

Figure 7:
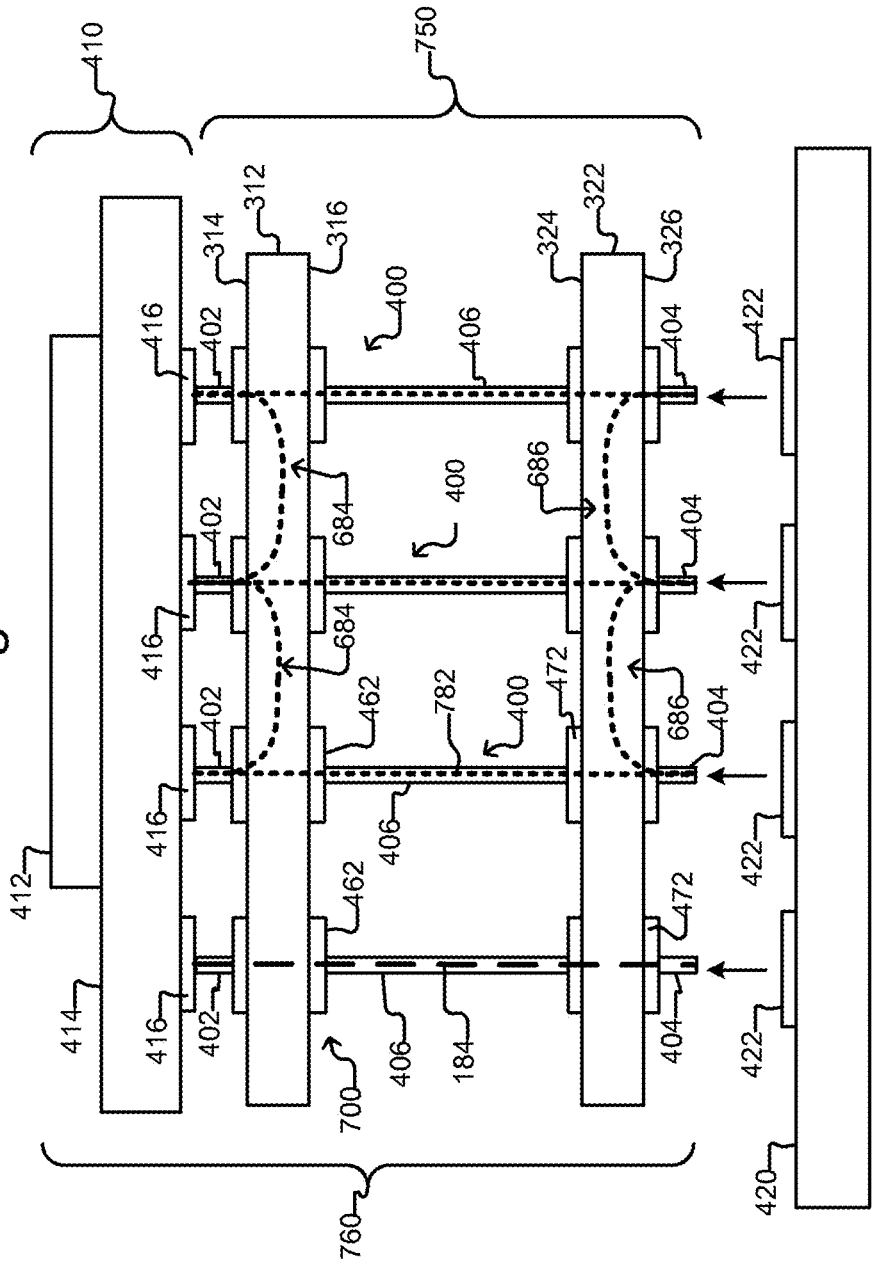
FIG. 7 is yet another example of a test contactor according to some embodiments of the invention.

The probe assembly 750 of FIG. 7 can be similar to the probe assembly 650 of FIG. 6 except that an insulated probe 700 can replace the multipath probe 100 of FIG. 6. The insulating probe 700 can electrically connect a wiring substrate terminal 416 to a DUT terminal 422 but does not contact or otherwise electrically connect to the first guide plate 312 or the second guide plate 322. Like the multipath probe 100, the insulated probe 700 can thus provide the signal path 182 of FIGS. 1A-1C but does not provide a secondary path (e.g., like secondary paths 184, 186 in FIGS. 1A-1C). The secondary probes 400, however, can provide daisy chained electrical paths 684, 686 in the guide plates 312, 322 as illustrated in FIG. 7 and generally as discussed above with respect to FIG. 6.

Figure 8:
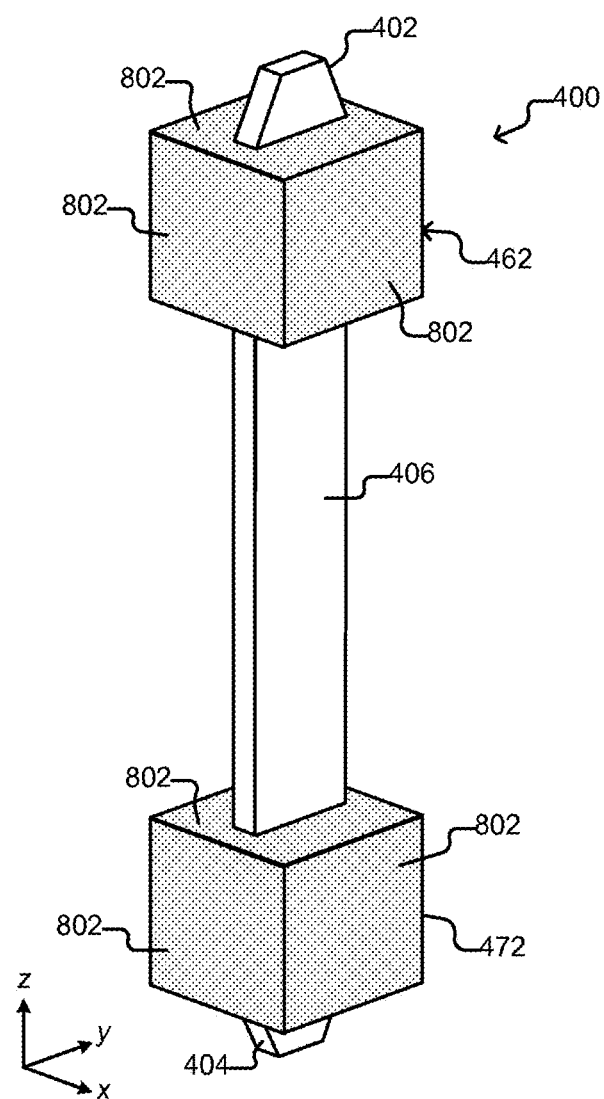
FIG. 8 shows a perspective view of an example of an insulated probe according to some embodiments of the invention.

The insulated probe 700 can be shaped or configured in any manner that allows the probe 700 to accomplish the foregoing. FIG. 8 illustrates an example of an insulating probe 700.

As shown, in the example illustrated in FIG. 8, the insulating probe 700 can be a secondary probe 400 with electrically insulating material 802 on at least the secondary contact 462 adjacent the first contact end 402 and the secondary contact 472 adjacent the second contact end 404. The secondary contacts 462, 472 can be entirely coated with the insulating material 802 as shown or can be coated only where the secondary contacts 462, 472 would be expected to contact a passage 318 through the first guide plate 312 or a passage 328 through the second guide plate 312. The secondary contacts 462, 472 can be coated with enough of the insulating material 802 to prevent the secondary contact 462 from forming an electrical connection in a passage 318 with the first guide plate 312 and to prevent the secondary contact 472 from forming an electrical connection in a passage 328 with the second guide plate 322. The secondary contacts 462, 472 and/or the body 406 can be coated with additional insulating material 802. The first contact end 402, however, can be sufficiently free from the insulating material 802 to contact and thereby form an electrical connecton with a corresponding wiring substrate terminal 416, and the second contact end 404 can similarly be sufficiently free from the insulating material 802 to contact and thereby form an electrical connection with a DUT terminal 422.

Generally as shown in FIG. 7, all of the probes 400, 700 in the probe assembly 760 can by substantially the same except that an insulating probe 700 includes the insulating coating 802 but the secondary probes 400 do not include the coating 802. For example, the shape and configuration (other than the presence or absence of the coating 802) of all of the probes 400, 700 can be substantially the same.

Figure 9:
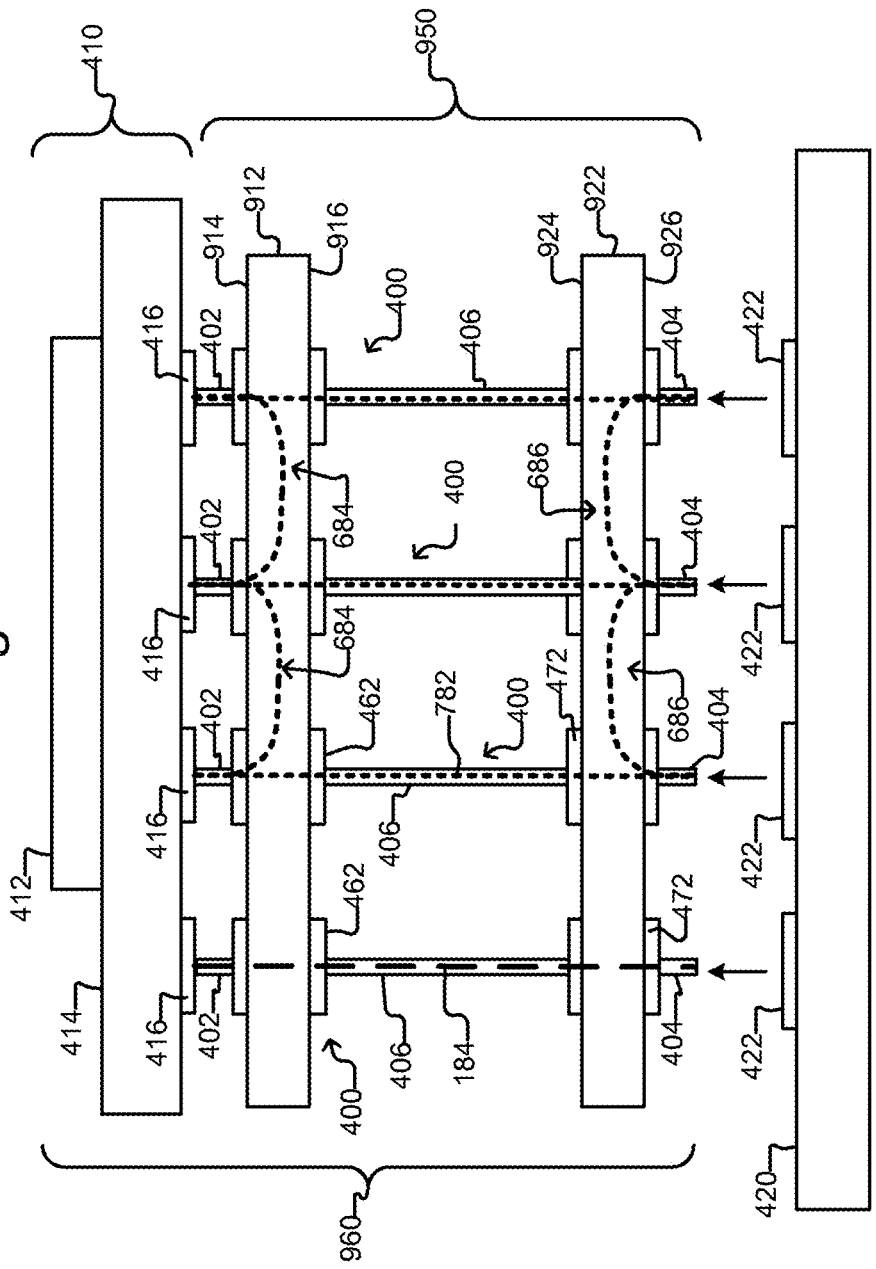
FIG. 9 illustrates still another example of a test contactor according to some embodiments of the invention.

The probe assembly 950 of FIG. 9 can be similar to the probe assembly 750 of FIG. 7 except that all of the probes can be substantially the same, and all probes can lack an insulating coating (e.g., like 802 in FIGS. 7 and 8). For example, each of the probes can have substantially the same shape, configuration, and/or the like. In the example illustrated in FIG. 9, the probes can be the secondary probes 400 of FIG. 5.

Figure 10:
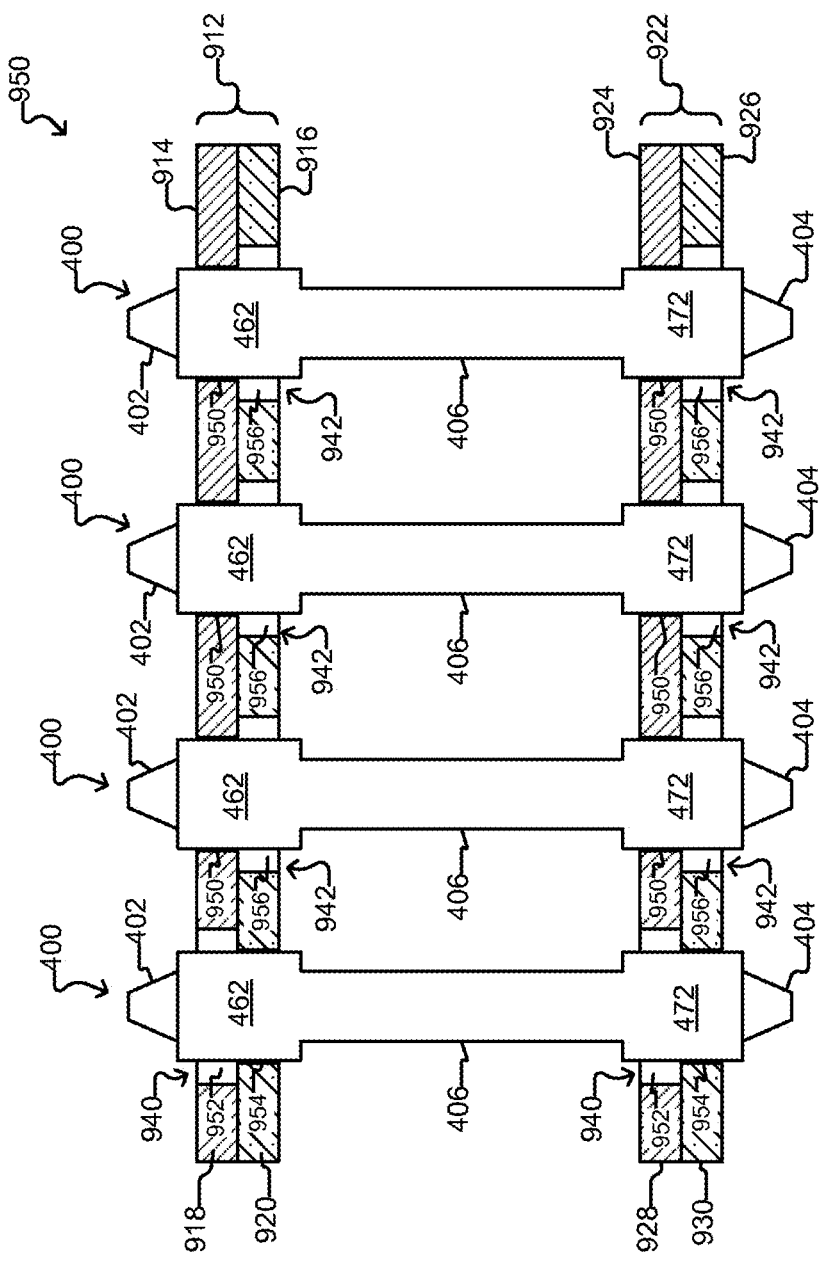
FIG. 10 is a side-cross sectional view of the probe assembly of FIG. 9 illustrating an example configuration of the probe assembly according to some embodiments of the invention.

As shown in FIG. 10, the probe assembly 950 can comprise substantially parallel composite guide plates 912, 922. The first composite guide plate 912 can comprise a first side 914 and an opposite second side 916, and the second composite guide plate 922 can also comprise a first side 924 and an opposite second side 926. The composite guide plates 912, 922 can be coupled to each other with a space between the guide plates 912, 922. For example, the guide plates 912, 922 can be coupled to each other by bolts, screws, clamps, adhesives, or the like.

The composite guide plates 912, 922 can comprise a plurality of layers. In the example shown in FIG. 10, the first guide plate 912 comprises an electrically conductive layer 918 and an electrically insulating layer 920, and the second guide plate 922 can likewise comprise a conductive layer 928 and an insulating layer 930.

At least two types of passages through the composite guide plates 912, 922 can be provided. An insulating passage 940 through one of the composite guide plates 912, 922 can electrically insulate a probe 400 in the insulating passage 940 from the conductive layer 918, 928 of the guide plate 912, 922, and a connection passage 942 can electrically connect a probe 400 in the connection passage 942 to the conductive layer 918, 928.

As illustrated in FIG. 10, an insulating passage 940 in the first guide plate 912 can comprise a wide conductive hole 952 through the conductive layer 918 and a substantially aligned close fit insulating hole 954 through the insulating layer 920. The wide conductive hole 952 can be substantially larger than the portion (e.g., the portion adjacent the first contact end 402 comprising the secondary contact 462) of a probe 400 disposed in the insulating passage 940, and the close fit insulating hole 954 can be substantially the same size as the portion (e.g., the portion adjacent the first contact end 402 comprising the secondary contact 462) of the probe 400 disposed in the insulating passage 940. For example, the width of the wide conductive hole 952 can be sufficiently large and the width of the close fit insulating hole 954 sufficiently small that the probe 400 disposed in the insulating passage 940 does not contact and electrically connect with the conductive layer 918 but is able to move (e.g., up and down in FIG. 10) in the insulating passage 940.

Similarly, a connection passage 942 in the first guide plate 912 can comprise a close fit conductive hole 950 through the conductive layer 918 and a substantially aligned wide insulating hole 956 through the insulating layer 920. The wide insulating hole 956 can be substantially larger than the portion (e.g., the portion adjacent the first contact end 402 comprising the secondary contact 462) of a probe 400 disposed in the connection passage 942, and the close fit conductive hole 950 can be substantially the same size as the portion (e.g., the portion adjacent the first contact end 402 comprising the secondary contact 462) of the probe 400 disposed in the connection passage 942. For example, the width of the wide insulating hole 956 can be sufficiently large and the width of the close fit conductive hole 950 sufficiently small that the probe 400 disposed in the connection passage 942 contacts and electrically connects with the conductive layer 918 but is able to move (e.g., up and down in FIG. 10) in the connection passage 942.

For each insulating passage 940 in the first guide plate 912, there can be a corresponding insulating passage 940 in the second guide plate 922 that insulates the corresponding probe 400 from the conductive layer 928 of the second guide plate 922. Likewise, for each connection passage 942 in the first guide plate 912, there can be a corresponding connection passage 942 in the second guide plate 922 that connects the corresponding probe 400 to the conductive layer 930 of the second guide plate 922.

Any of the probes 400 in the probe assembly 950 of FIG. 9 can thus be insulated from the guide plates 912, 922 and thus provide a signal path 184 (see FIGS. 1A-1C) from the first end 402 of the probe 400 to the second end 404 by disposing the probe 400 in insulating passages 940 in the first and second guide plates 912, 922. Likewise, any of the probes 400 in the probe assembly 950 of FIG. 9 can be electrically connected to the guide plates 912, 922 and thus provide a secondary path 782 (see FIG. 7) that comprises the guide plates 912, 922 by disposing the probe 400 in connection passages 942 in the first and second guide plates 912, 922. In the example illustrated in FIG. 9, the left most probe 400 is configured to provide a signal path 182 and the other three probes 400 are configured to provide secondary paths 782 (see FIG. 7). The foregoing is similar to and, as shown in FIG. 9, provides similar electrical paths 184, 782, 684 shown in and discussed above with respect to FIG. 7.

In some embodiments of the invention, ground pins connecting the electrically conductive guide plates can be used in order to improve high frequency probe performance via improved impedance matching. This amounts to presently preferred configurations for the secondary conduction paths as described above and as applied to ground connections in a probe array.

Figure 11:
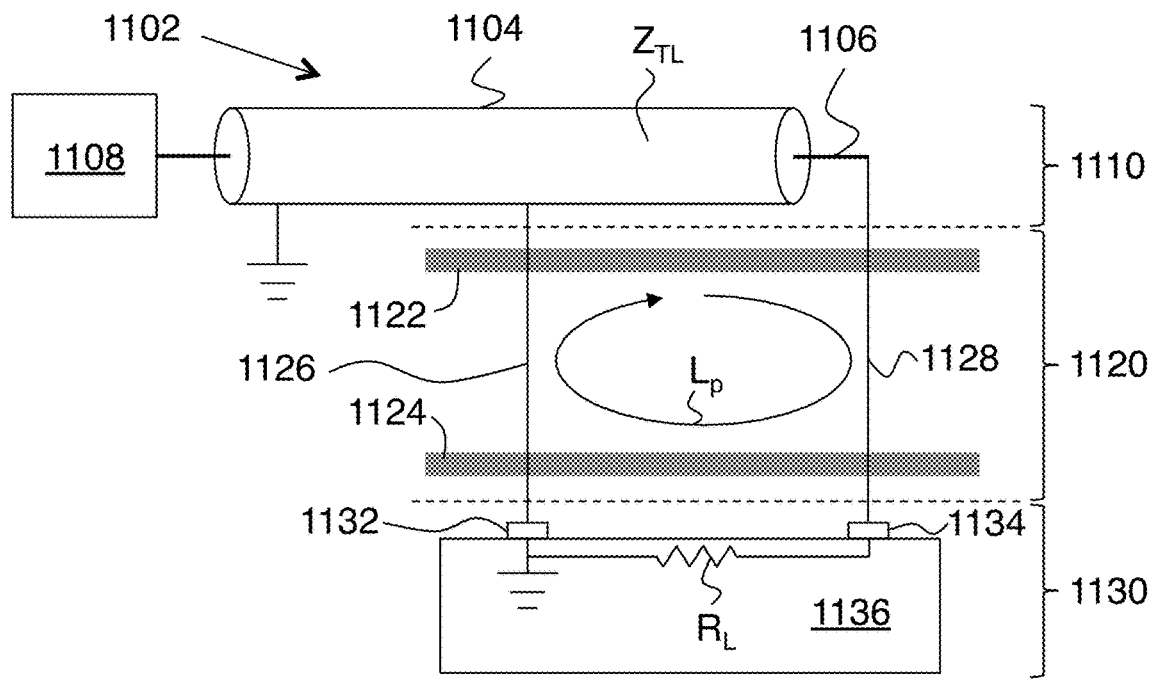
FIG. 11 schematically shows electrical characteristics of a conventional probe array having insulating guide plates.

To better appreciate these embodiments, it is helpful to consider electrical characteristics of a conventional probe array having insulating guide plates, as shown on FIG. 11. In this example, 1110 refers generally to the electrical test apparatus (e.g., a space transformer), 1120 refers generally to the probe head, and 1130 refers generally to the device under test. The output from electrical test apparatus 1108 is schematically represented by a coaxial transmission line 1102 having signal line 1106 and ground 1104 and having characteristic impedance $Z_{TL}$ (typically 50Ω).

The probe head is schematically represented by insulating guide plates 1122 and 1124, ground probe 1126, and signal probe 1128. The device under test is schematically represented by ground terminal 1132, signal terminal 1134, and load impedance $R_L$, all disposed on substrate 1136 (e.g., an integrated circuit wafer or die). Here DUT terminals 1132 and 1134 can be fabricated as any conventional contacting structure, such as pads (as shown), balls or pillars.

An important feature of this electrical configuration is the probe head partial inductance $L_P$. This inductance is a function of probe geometry (primarily their length), as well as the number and geometrical arrangement of the ground probes relative to the signal probes. For simplicity FIG. 11 only shows one ground probe and one signal probe, but probe heads in practice often have many probes of both types, and can even have multiple ground probes corresponding to each signal probe. In simple 2d examples, $L_P$ can be thought of as mainly determined by the area enclosed in the relevant current loop (shaded in FIG. 12).

Figure 12:
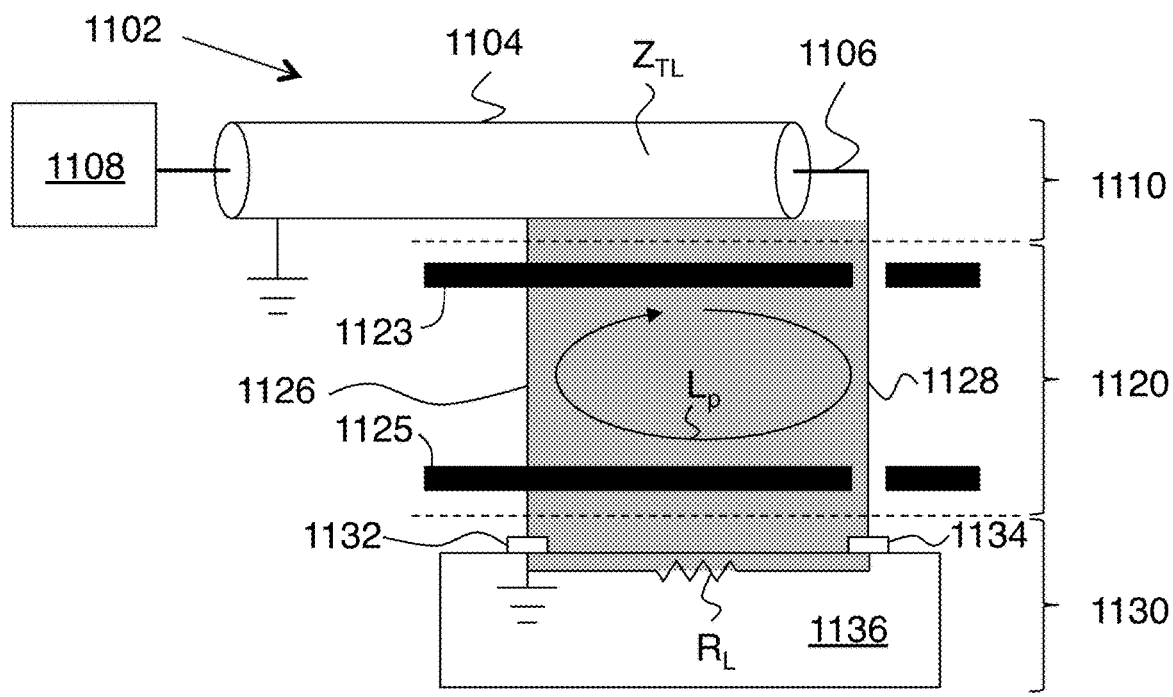
FIG. 12 schematically shows electrical characteristics of a conventional probe array having conductive guide plates.

The example of FIG. 12 is similar to the example of FIG. 11, except that insulating guide plates 1122 and 1124 on FIG. 11 are replaced with electrically conductive guide plates 1123 and 1125, respectively, on FIG. 12. As shown on FIGS. 11 and 12, introduction of the metal guide plates does not significantly affect the probe head partial inductance $L_P$. This is because the loop area is basically not changed by this modification. Some amount of capacitance is present between signal probe 1128 and guide plates 1123 and 1125, as determined by the geometry of the gaps between probe 1128 and the guide plates 1123 and 1125.

Figure 13:
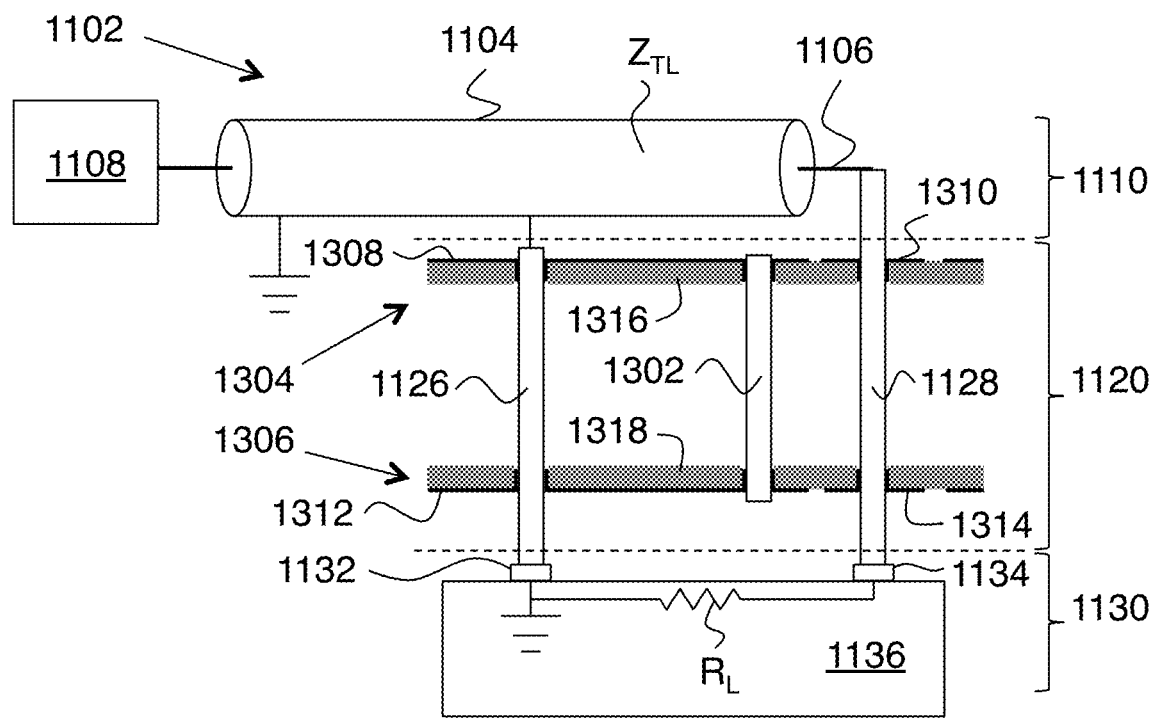
FIG. 13 shows an embodiment where ground pins are used to reduce probe inductance.

FIG. 13 schematically shows an embodiment of the invention. Here slightly more mechanical detail is shown than in FIGS. 11-12. More specifically, FIG. 13 shows implementation of conductive guide plates using conductive traces disposed on insulating substrates. In particular, guide plate 1304 has a ground trace 1308 connected to ground probe 1126 and disposed on insulating substrate (e.g., a ceramic) 1316. In such structures, signal probe 1128 will typically also be connected to a conductive trace (trace 1310 in this example), and electrical insulation between the signal probe and the ground probe is provided by a gap between the two conductive traces, as shown. Similarly, guide plate 1306 has a ground trace 1312 connected to ground probe 1126 and disposed on insulating substrate (e.g., a ceramic) 1318. In such structures, signal probe 1128 will typically also be connected to a conductive trace (trace 1314 in this example), and electrical insulation between the signal probe and the ground probe is provided by a gap between the two conductive traces, as shown. These gaps can be designed or structured in various ways to control the corresponding capacitances, which can be helpful for impedance matching.

The key feature of FIG. 13 is the presence of ground pin 1302. As shown on FIG. 13, ground pin 1302 is electrically connected to ground traces 1308 and 1312 of the guide plates, but does not mechanically make contact to the ground terminals of the electrical test apparatus or to the ground terminals of the device under test. This lack of such mechanical connections is what distinguishes ground pins from ground probes. Practice of the invention does not depend critically on the shape of the ground pins. For example, they can have circular, square or rectangular cross sections. Rectangular ground pin cross section shapes can be used to make the ground pin configuration provide more of a ground wall.

Figure 14:
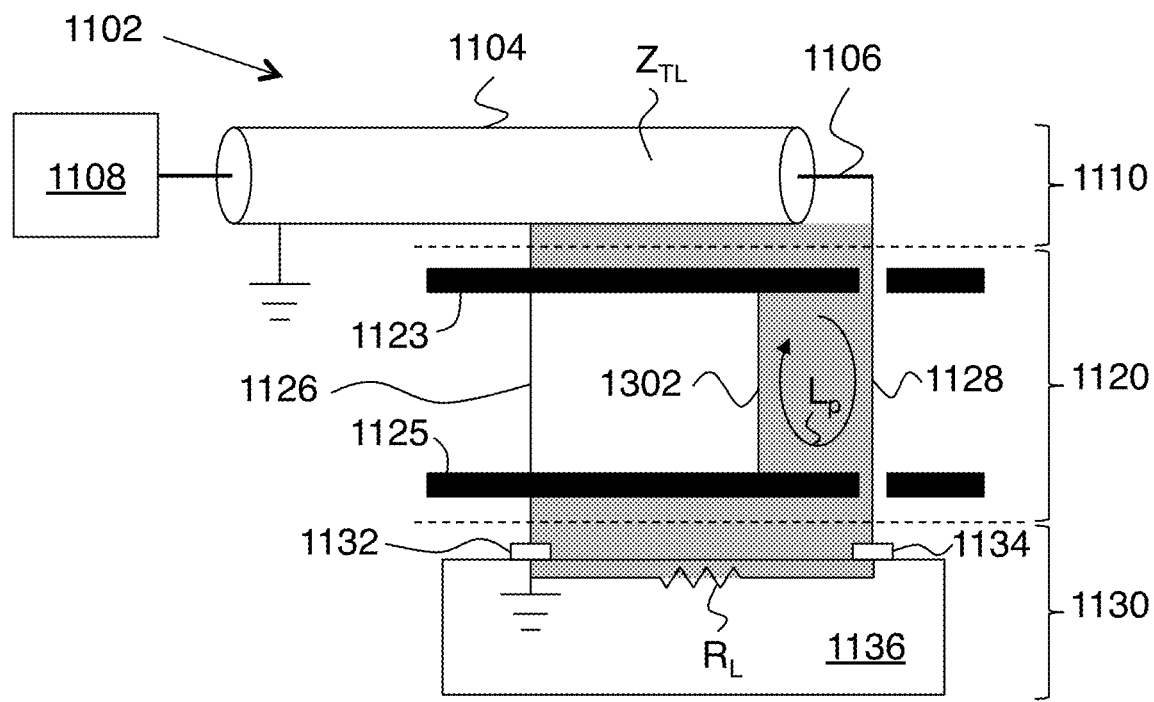
FIG. 14 schematically shows electrical characteristics of the embodiment of FIG. 13.

The effect of the ground pin is shown on FIG. 14, which can be compared to FIG. 12. In the simple 2D configuration shown on FIGS. 12 and 14, the effect of ground pin 1302 is to reduce the loop area that determines inductance $L_P$ as shown by the respective shaded areas. Excess probe inductance is the main reason it is difficult to impedance match probes to test equipment and to devices under test at high frequency, so such reduction of probe inductance is highly desirable. Thus we have the surprising feature that ground pin connections that seem to go nowhere (i.e., they don't touch the space transformer or the device under test) have been found to be useful. As suggested by FIG. 14, another embodiment is one where the signal pin is electrically insulated from any metal on the guide plates.

Figure 15:
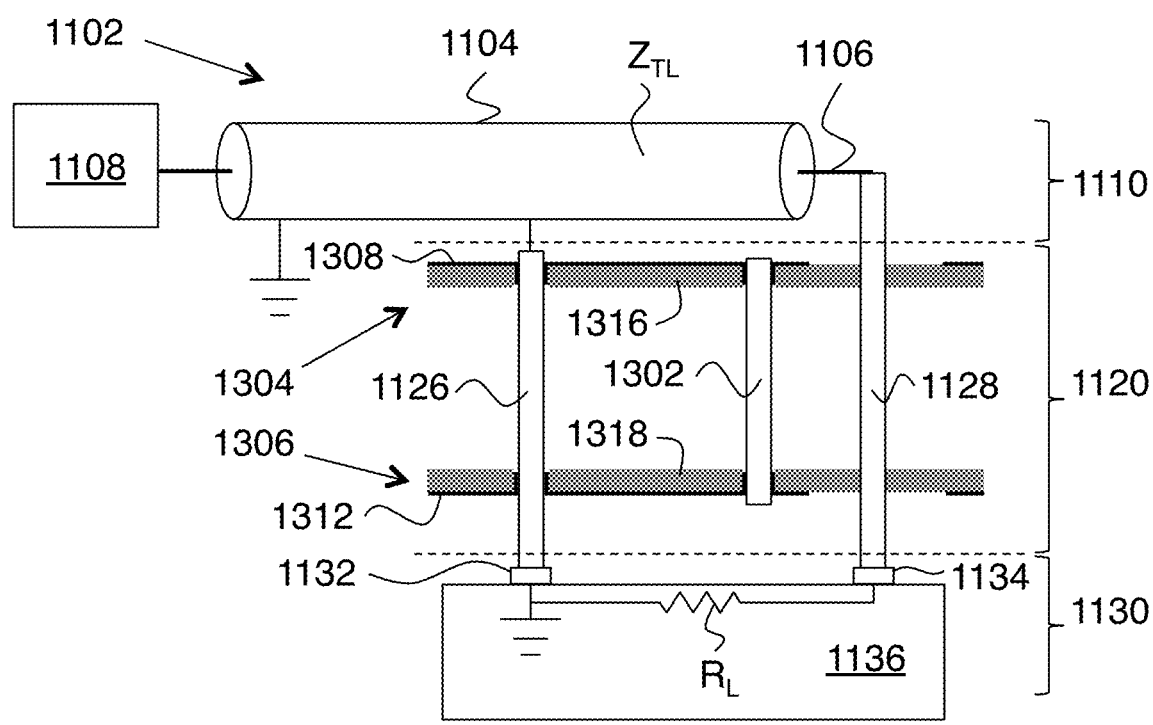
FIG. 15 shows a second embodiment where ground pins are used to reduce probe inductance.

FIG. 15 shows an exemplary embodiment along these lines. It is the same as the structure of FIG. 13, except for the omission of traces 1310 and 1314 disposed on the guide plates and connected to signal probe 1128. Instead, signal probe 1128 on FIG. 15 does not make contact to any metal on the guide plates, as shown.

Figure 16:
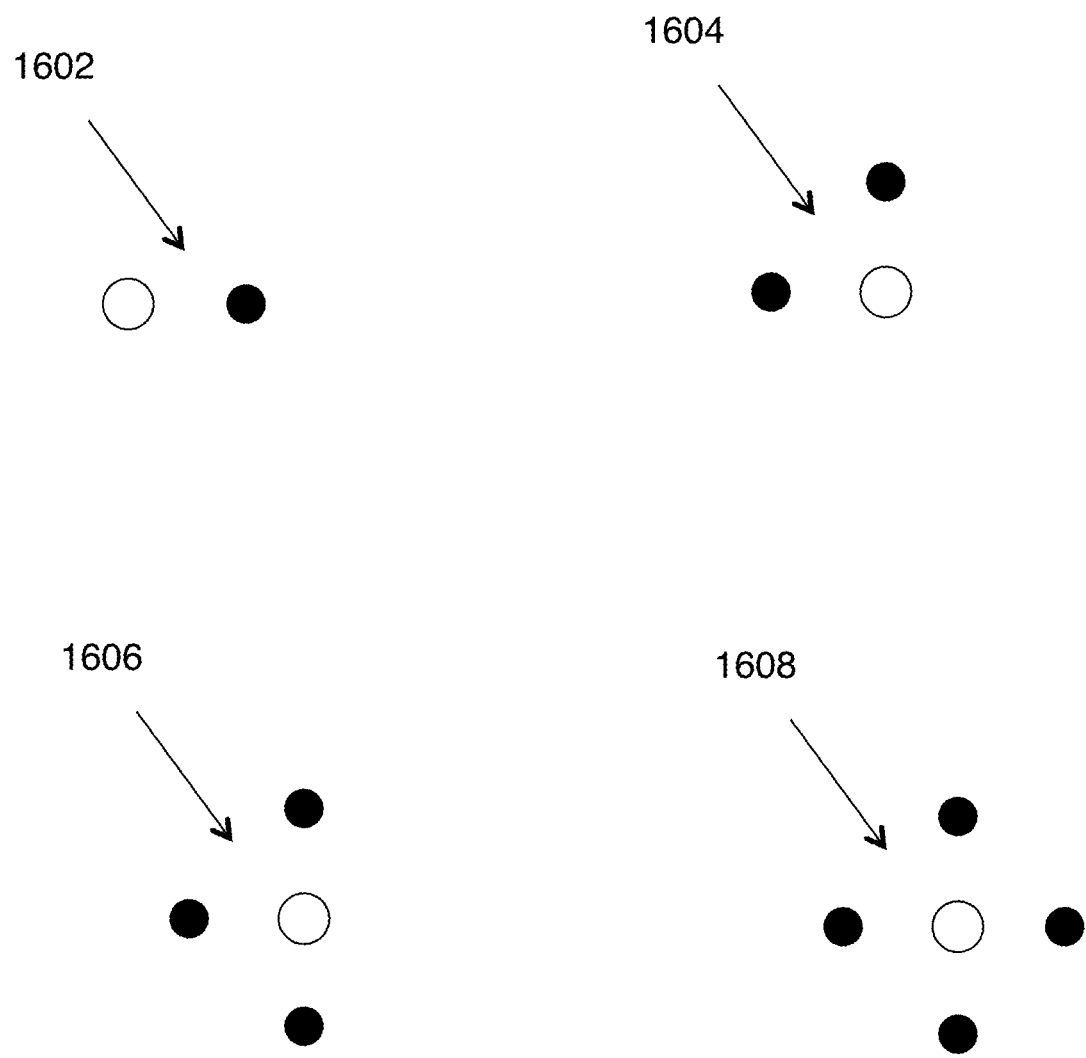
FIG. 16 schematically shows several exemplary ground pin patterns.

Although FIGS. 13-15 only show one ground pin, any number or arrangement of ground pins can be used in connection with a corresponding signal probe. FIG. 16 shows several exemplary signal probe (open circle) and ground pin (filled circles) configurations. Here 1602 shows a signal probe having a single nearby ground pin, 1604 shows a signal probe having two nearby ground pins, 1606 shows a signal probe having three nearby ground pins, and 1608 shows a signal probe having four nearby ground pins. It is important to note that ground pins can be disposed in relation to the signal probes in any arrangement that can be fabricated, without regard to the underlying pitch of the terminals on the device under test. In contrast, ground probes must be spaced apart from signal probes by distances that are determined by the corresponding terminals on the device under test, and this constraint on the geometry would make impedance matching by positioning the ground probes difficult or even impossible.

Figure 17:
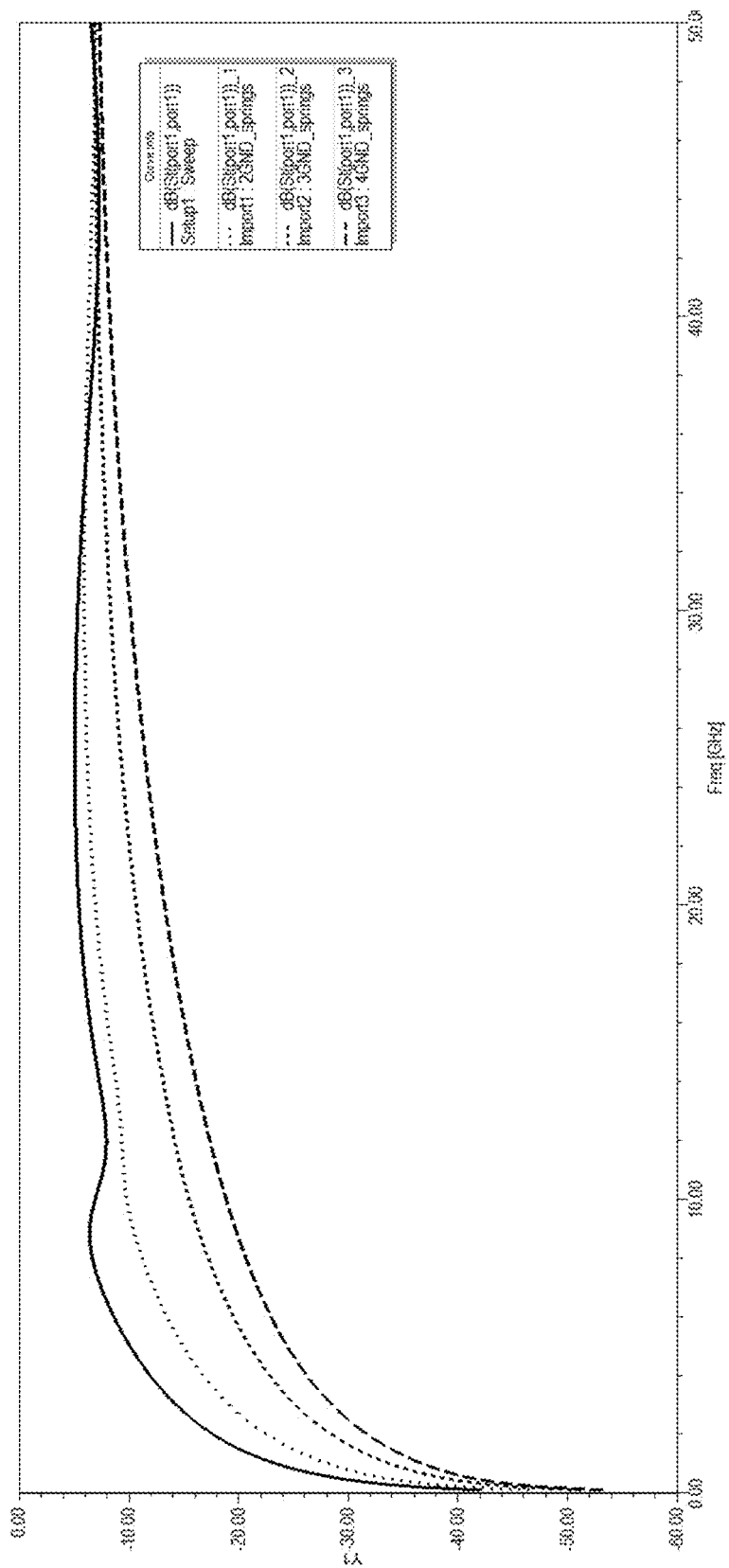
FIG. 17 shows results for several different ground pin patterns.

FIG. 17 shows modeled results for a probe array having various ground pin configurations. As the number of ground pins per signal probe increases from 1 to 2 to 3 to 4 in the configurations of FIG. 15, the bandwidth increases from 3 GHz to 5 GHz to 11 GHz to 17 GHz, respectively. This increase in bandwidth is from improved impedance matching.

Although specific embodiments and applications of the invention have been described in this specification, these embodiments and applications are exemplary only, and many variations are possible.

The invention claimed is:

1. An electrical apparatus comprising:
   a first guide plate including a first electrically conductive ground trace disposed on a first electrically insulating substrate;
   a second guide plate including a second electrically conductive ground trace disposed on a second electrically insulating substrate;
   two or more probes disposed to pass through corresponding holes in the first and second guide plates;
   wherein the two or more probes include one or more signal probes that are electrically insulated from both the first and second electrically conductive ground traces, wherein the signal probes are configured to make temporary electrical contact between signal terminals of an electrical test apparatus and signal terminals of a device under test;
   wherein the two or more probes include one or more ground probes that are electrically connected to both the first and second electrically conductive ground traces, wherein the ground probes are configured to make temporary electrical contact between ground terminals of the electrical test apparatus and ground terminals of the device under test; and
   at least one ground pin electrically connected to both the first and second electrically conductive ground traces, wherein the ground pins do not mechanically make contact to the ground terminals of the electrical test apparatus, and wherein the ground pins do not mechanically make contact to the ground terminals of the device under test.

2. The apparatus of claim 1, wherein a configuration of the ground pins, signal probes and ground probes is selected to improve a source impedance match of the signal probes and ground probes to an impedance of the electrical test apparatus.

3. The apparatus of claim 2, wherein the configuration of the ground pins is a pattern of one or more ground pins disposed at predetermined positions relative to a corresponding signal probe.

4. The apparatus of claim 2, wherein the configuration of the ground pins, signal probes and ground probes is also selected to improve a load impedance match of the signal probes and ground probes to an impedance of the device under test.

5. The apparatus of claim 4, wherein the configuration of the ground pins is a pattern of one or more ground pins disposed at predetermined positions relative to a corresponding signal probe.

6. The apparatus of claim 1, wherein a configuration of the ground pins, signal probes and ground probes is selected to improve a load impedance match of the signal probes and ground probes to an impedance of the device under test.

7. The apparatus of claim 6, wherein the configuration of the ground pins is a pattern of one or more ground pins disposed at predetermined positions relative to a corresponding signal probe.

8. An electrical apparatus comprising:
a first electrically conductive guide plate;
a second electrically conductive guide plate;
two or more probes disposed to pass through corresponding holes in the first and second guide plates;
wherein the two or more probes include one or more signal probes that are electrically insulated from both the first and second electrically conductive guide plates, wherein the signal probes are configured to make temporary electrical contact between signal terminals of an electrical test apparatus and signal terminals of a device under test;
wherein the two or more probes include one or more ground probes that are electrically connected to both the first and second electrically conductive guide plates, wherein the ground probes are configured to make temporary electrical contact between ground terminals of the electrical test apparatus and ground terminals of the device under test; and
at least one ground pin electrically connected to both the first and second electrically conductive guide plates, wherein the ground pins do not mechanically make contact to the ground terminals of the electrical test apparatus, and wherein the ground pins do not mechanically make contact to the ground terminals of the device under test.

9. The apparatus of claim 8, wherein a configuration of the ground pins, signal probes and ground probes is selected to improve a source impedance match of the signal probes and ground probes to an impedance of the electrical test apparatus.

10. The apparatus of claim 9, wherein the configuration of the ground pins is a pattern of one or more ground pins disposed at predetermined positions relative to a corresponding signal probe.

11. The apparatus of claim 9, wherein the configuration of the ground pins, signal probes and ground probes is also selected to improve a load impedance match of the signal probes and ground probes to an impedance of the device under test.

12. The apparatus of claim 11, wherein the configuration of the ground pins is a pattern of one or more ground pins disposed at predetermined positions relative to a corresponding signal probe.

13. The apparatus of claim 8, wherein a configuration of the ground pins, signal probes and ground probes is selected to improve a load impedance match of the signal probes and ground probes to an impedance of the device under test.

14. The apparatus of claim 13, wherein the configuration of the ground pins is a pattern of one or more ground pins disposed at predetermined positions relative to a corresponding signal probe.

* * * * *